(12) United States Patent
Miyairi et al.

(10) Patent No.: US 8,101,442 B2
(45) Date of Patent: Jan. 24, 2012

(54) METHOD FOR MANUFACTURING EL DISPLAY DEVICE

(75) Inventors: Hidekazu Miyairi, Kanagawa (JP); Shigeki Komori, Kanagawa (JP); Toshiyuki Isa, Kanagawa (JP); Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 35 days.

(21) Appl. No.: 12/390,264

(22) Filed: Feb. 20, 2009

(65) Prior Publication Data
US 2009/0224249 A1 Sep. 10, 2009

(30) Foreign Application Priority Data
Mar. 5, 2008 (JP) .................. 2008-055024

(51) Int. Cl.
| H01L 21/00 | (2006.01) |
| H01L 21/04 | (2006.01) |
| H01L 21/14 | (2006.01) |
| H01L 21/15 | (2006.01) |
| H01L 31/036 | (2006.01) |

(52) U.S. Cl. ...... 438/29; 438/149; 257/72; 257/E33.053
(58) Field of Classification Search .................. None
See application file for complete search history.

(56) References Cited

U.S. PATENT DOCUMENTS

| 4,409,134 A | 10/1983 | Yamazaki |
| RE34,658 E | 7/1994 | Yamazaki et al. |
| 5,510,916 A | 4/1996 | Takahashi |
| 6,008,065 A | 12/1999 | Lee et al. |
| 6,132,800 A | 10/2000 | Shimada et al. |
| 6,485,997 B2 | 11/2002 | Lee et al. |
| 6,493,048 B1 | 12/2002 | Baek et al. |
| 6,509,215 B2 | 1/2003 | Fujikawa et al. |
| 6,623,653 B2 | 9/2003 | Furuta et al. |
| 6,630,687 B1 | 10/2003 | Koyama et al. |
| 6,635,581 B2 | 10/2003 | Wong |
| 6,909,409 B2 * | 6/2005 | Tanada ............ 345/51 |
| 7,023,021 B2 | 4/2006 | Yamazaki et al. |

(Continued)

FOREIGN PATENT DOCUMENTS
JP 6484669 A 3/1989
(Continued)

OTHER PUBLICATIONS

C.W. Kim et al.; "42.1: A Novel Four-Mask-Count Process Architecture for TFT-LCDs"; *SID Digest '00 : SID International Symposium Digest of Technical Papers*; pp. 1006-1009; 2000.

(Continued)

*Primary Examiner* — Ha Tran T Nguyen
*Assistant Examiner* — Shaka Scarlett
(74) *Attorney, Agent, or Firm* — Fish & Richardson P.C.

(57) ABSTRACT

A manufacture process of a thin film transistor mounted on an EL display device is simplified. A thin film transistor is manufactured by stacking a first conductive film, an insulating film, a semiconductor film, an impurity semiconductor film, and a second conductive film; forming a first resist mask over the stacked films; performing first etching to form a thin-film stack body; performing second etching by side etching is conducted on the thin-film stack body to form a gate electrode layer; and forming a source and drain electrode layer and the like with use of a second resist mask. An EL display device is manufactured using the thin film transistor.

10 Claims, 22 Drawing Sheets

U.S. PATENT DOCUMENTS

| | | | |
|---|---|---|---|
| 7,116,384 B2 | 10/2006 | Chen | |
| 7,223,643 B2 | 5/2007 | Ohnuma et al. | |
| 7,315,344 B2 | 1/2008 | Lim | |
| 7,522,226 B2 | 4/2009 | Park et al. | |
| 7,588,970 B2 | 9/2009 | Ohnuma et al. | |
| 7,608,490 B2 | 10/2009 | Yamazaki et al. | |
| 7,749,820 B2 | 7/2010 | Miyairi | |
| 7,776,664 B2 | 8/2010 | Fujikawa et al. | |
| 7,790,483 B2 | 9/2010 | Miyairi et al. | |
| 7,807,516 B2 | 10/2010 | Ohnuma et al. | |
| 7,821,613 B2 | 10/2010 | Kimura | |
| 7,824,939 B2 | 11/2010 | Hosoya et al. | |
| 7,842,528 B2 | 11/2010 | Fujikawa et al. | |
| 7,883,943 B2 | 2/2011 | Miyairi et al. | |
| 2001/0049064 A1 | 12/2001 | Lee et al. | |
| 2002/0125477 A1 | 9/2002 | So et al. | |
| 2003/0013236 A1 | 1/2003 | Nakata et al. | |
| 2005/0158925 A1* | 7/2005 | Kim | 438/151 |
| 2005/0263768 A1 | 12/2005 | Ahn | |
| 2005/0270434 A1 | 12/2005 | Jung et al. | |
| 2006/0290867 A1 | 12/2006 | Ahn et al. | |
| 2007/0002249 A1 | 1/2007 | Yoo et al. | |
| 2007/0023790 A1 | 2/2007 | Ohnuma et al. | |
| 2007/0037070 A1 | 2/2007 | Ohnuma et al. | |
| 2007/0085475 A1 | 4/2007 | Kuwabara et al. | |
| 2007/0126969 A1 | 6/2007 | Kimura et al. | |
| 2007/0139571 A1 | 6/2007 | Kimura | |
| 2007/0146591 A1 | 6/2007 | Kimura et al. | |
| 2007/0210344 A1 | 9/2007 | Arao et al. | |
| 2007/0222936 A1 | 9/2007 | Shih | |
| 2009/0091677 A1 | 4/2009 | Cho et al. | |
| 2009/0101906 A1 | 4/2009 | Hosoya et al. | |
| 2009/0108260 A1 | 4/2009 | Lin et al. | |
| 2009/0148970 A1 | 6/2009 | Hosoya et al. | |
| 2009/0152559 A1* | 6/2009 | Miyairi et al. | 257/66 |
| 2009/0212296 A1* | 8/2009 | Mizoguchi et al. | 257/71 |
| 2009/0212300 A1* | 8/2009 | Komori | 257/72 |
| 2009/0227051 A1 | 9/2009 | Miyairi et al. | |
| 2009/0227076 A1* | 9/2009 | Miyairi | 438/151 |
| 2009/0233389 A1 | 9/2009 | Miyairi et al. | |
| 2009/0261334 A1 | 10/2009 | Ahn | |
| 2009/0261369 A1 | 10/2009 | Komori et al. | |
| 2010/0073612 A1 | 3/2010 | Kim et al. | |
| 2010/0230683 A1 | 9/2010 | Miyairi | |

FOREIGN PATENT DOCUMENTS

| | | |
|---|---|---|
| JP | 03-011744 | 1/1991 |
| JP | 3161938 A | 7/1991 |
| JP | 4188770 A | 7/1992 |
| JP | 07-307477 A | 11/1995 |
| JP | 2000-307118 A | 11/2000 |
| JP | 2003-179069 | 6/2003 |
| JP | 2007-133371 | 5/2007 |
| WO | WO2008099528 A1 | 8/2008 |

OTHER PUBLICATIONS

International Search Report (PCT Application No. PCT/JP2009/053465) dated May 26, 2009, 2 pages (in English).

Written Opinion of the International Searching Authority (PCT Application No. PCT/JP2009/053465) dated May 26, 2009, 3 pages (in English).

Notification of Transmittal of the International Search Report and The Written Opinion of the International Searching Authority, or the Declaration (PCT Application No. PCT/JP2008/071746) dated Dec. 22, 2008, 4 pages (in English).

International Search Report (PCT Application No. PCT/JP2008/071746) dated Dec. 22, 2008, 2 pages (in English).

Written Opinion of the International Searching Authority (PCT Application No. PCT/JP2008/071746) dated Dec. 22, 2008, 4 pages (in English).

* cited by examiner 100 102 104 106

100 102 104 106

116C    116B (A-1)

(A-2) Light transmittance (B-1)

(B-2) Light transmittance

METHOD FOR MANUFACTURING EL DISPLAY DEVICE

BACKGROUND OF THE INVENTION

1. Field of the Invention

The present invention relates to a method for manufacturing an EL display device which includes thin film transistors.

2. Description of the Related Art

In recent years, thin film transistors each of which are formed using a semiconductor thin film with a thickness of several nanometers to several hundreds of nanometers over a substrate having an insulating surface such as a glass substrate have attracted attention. Such thin film transistors are widely used for ICs (integrated circuits) and electronic devices such as electrooptic devices. In particular, rapid development of thin film transistors as switching elements of image display devices typified by liquid crystal display devices, EL (electro luminescence) display devices, and the like has been demanded.

In an active matrix EL display device, voltage is applied between a pair of electrodes of a light-emitting element provided in a selected pixel, which sandwiches an EL layer, whereby current flows through the EL layer and then a light-emitting layer emits light. This light emission is viewed as a display pattern by a viewer. Note that the active matrix EL display device here indicates an EL display device which forms a display pattern on a screen by driving pixels arranged in matrix by switching elements.

The range of uses for such an active matrix EL display device has been increasing, and demanded levels of a size of a screen, definition, and an aperture ratio are growing higher. In addition, high reliability is demanded in the active matrix EL display device, and high productivity and low production cost are demanded in a production method thereof. As for increasing productivity and reducing production cost, simplification of a process is given as one of measures.

In the active matrix EL display device, thin film transistors are mainly used as switching elements. In manufacture of a thin film transistor, it is important for simplification of a process to reduce the number of photomasks used for photolithography. For example, if one photomask is added, the following steps are further needed: steps such as resist application, prebaking, light exposure, development, postbaking, and the like; steps such as film formation and etching before and after the aforementioned steps; and then steps such as resist removal, cleaning, drying, and the like. That is, the number of steps is significantly increased only by addition of one photomask used in the manufacture process. Therefore, many techniques for reducing photomasks in the manufacture process have been developed.

Thin film transistors are roughly classified into a top-gate type thin film transistor in which a channel formation region is provided below a gate electrode and a bottom-gate type thin film transistor in which a channel formation region is provided above a gate electrode. It is known that the number of photomasks used in the manufacture process of the bottom-gate type thin film transistor is less than the number of photomasks used in the manufacture process of the top-gate type thin film transistors. Three photomasks are generally used for manufacture of the bottom-gate type thin film transistor.

Many conventional techniques for reducing the number of photomasks use a complicated technique such as backside light exposure, resist reflow, or a lift-off method, which requires a special apparatus. There has been a concern that yield is reduced due to various problems caused by usage of such a complicated technique. The number of photomasks has managed to be reduced at the cost of electric characteristics of thin film transistors.

As typical means for reducing the number of photomasks in a manufacture process of a thin film transistor, a technique using a multi-tone mask (called a half-tone mask or a gray-tone mask) is widely known. For example, Reference 1 (Japanese Published Patent Application No. 2003-179069) discloses a technique for reducing the number of manufacturing steps by using a multi-tone mask.

SUMMARY OF THE INVENTION

However, even in the case where a bottom-gate thin film transistor is manufactured using the above multi-tone mask, at least two photomasks are required, and it is difficult to further reduce the number of photomasks. Here, one of the two photomasks is used for patterning of a gate electrode layer.

In view of the above problems, an object of an embodiment of the invention is to provide a new method for manufacturing a thin film transistor which requires no to additional photomask for patterning a gate electrode layer. Namely, a manufacturing method is disclosed, which enables the manufacture of a thin film transistor without complicated technique even if only a single photomask is employed.

This method makes it possible to reduce the number of photomasks in a manufacture of a thin film transistor compared with the conventional photolithography technique.

A thin film transistor which is one embodiment of the invention can be specifically applied to a thin film transistor used for a pixel in an EL display device. An object of one embodiment of the invention to be disclosed is to reduce the number of photomasks used through a photolithography process as compared to that used through a photolithography process in the conventional method, without using a complicated technique, in manufacture of the EL display device. An object of one embodiment of the invention is to simplify a manufacture process of the EL display device.

In a method for manufacturing a thin film transistor which is one embodiment of the invention, a first conductive film is formed; a thin-film stack body in which an insulating film, a semiconductor film, an impurity semiconductor film, and a second conductive film are stacked in this order is formed over the first conductive film; first etching is performed to expose the first conductive film and form at least a pattern of the thin-film stack body; and second etching is performed to form a pattern of the first conductive film. Here, the second etching is performed so that the first conductive film can be subjected to side etching.

Here, although the first etching may be dry etching or wet etching, it is preferable to perform highly anisotropic etching (physical etching) as the first etching. With use of highly anisotropic etching for the first etching, processing precision of a pattern can be improved. Note that in the case where dry etching is performed as the first etching, the first etching can be performed in one step; however, in a case where wet etching is performed, the first etching is performed in a plurality of steps. Accordingly, dry etching is preferably used for the first etching.

Further, although the second etching may be dry etching or wet etching, it is preferable to perform highly isotropic etching (chemical etching). With use of highly isotropic etching (chemical etching) for the second etching, the first conductive film can be subjected to side etching. Accordingly, wet etching is preferably used for the second etching.

Here, since the second etching is performed on condition that the first conductive film is subjected to side etching, side surfaces of the first conductive film are etched to be on the inner side than side surfaces of the thin-film stack body which has been patterned. Accordingly, after the second etching, the side surfaces of the first conductive film are on the inner side than the side surfaces of the thin-film stack body which has been patterned. Furthermore, the distance between the side of the first conductive film which has been patterned and the side surface of the thin-film stack body which has been patterned is almost uniform.

Note that the "pattern of the first conductive film" is represented by, for example, a top view layout of a metal wiring which forms a gate electrode, a gate wiring, and a capacitor electrode.

An embodiment of the invention to be disclosed is a method for manufacturing an EL display device which includes a thin film transistor in which a gate electrode layer is formed by side etching and a source and drain electrode layer is formed above the gate electrode layer with use of a resist mask which has a recessed portion preferably.

An embodiment of the invention to be disclosed is a method for manufacturing an EL display device including the following steps. A thin film transistor is formed by sequentially stacking a first conductive film, a first insulating film, a semiconductor film, an impurity semiconductor film, and a second conductive film; forming a first resist mask over the second conductive film; performing first etching on the first insulating film, the semiconductor film, the impurity semiconductor film, and the second conductive film with use of the first resist mask to expose at least a surface of the first conductive film; performing second etching on a part of the first conductive film to form a gate electrode layer in such a manner that a width of the gate electrode is narrower than a width of the first insulating film; forming a second resist mask over the second conductive film; and performing third etching on the second conductive film, the impurity semiconductor film, and a part of the semiconductor film with use of the second resist mask to form a source and drain electrode layer, a source and drain region layer, and a semiconductor layer. Then, the second resist mask is removed. A second insulating film is formed to cover the thin film transistor. An opening is formed in the second insulating film so as to expose a part of the source and drain electrode layer. A first pixel electrode is selectively formed over the opening and the second insulating film. An EL layer is formed over the first pixel electrode.
A second pixel electrode is formed over the EL layer.

An embodiment of the invention to be disclosed is a method for manufacturing an EL display device including the following steps. A thin film transistor is formed by sequentially stacking a first conductive film, a first insulating film, a semiconductor film, an impurity semiconductor film, and a second conductive film; forming a first resist mask over the second conductive film; performing first etching on the first insulating film, the semiconductor film, the impurity semiconductor film, and the second conductive film with use of the first resist mask to expose at least a surface of the first conductive film; forming a second resist mask over the second conductive film; after forming the second resist mask, performing second etching on a part of the first conductive film to form a gate electrode layer in such a manner that a width of the gate electrode is narrower than a width of the first insulating film; and performing third etching on the second conductive film, the impurity semiconductor film, and a part of the semiconductor film with use of the second resist mask to form a source and drain electrode layer, a source and drain region layer, and a semiconductor layer. Then, the second resist mask is removed. A second insulating film is formed to cover the thin film transistor. An opening is formed in the second insulating film so as to expose a part of the source and drain electrode layer. A first pixel electrode is selectively formed over the opening and the second insulating film. An EL layer is formed over the first pixel electrode. A second pixel electrode is formed over the EL layer.

An embodiment of the invention to be disclosed is a method for manufacturing an EL display device including the following steps. A thin film transistor is formed by sequentially stacking a first conductive film, a first insulating film, a semiconductor film, an impurity semiconductor film, and a second conductive film; forming a first resist mask having a recessed portion over the second conductive film; performing first etching on the first insulating film, the semiconductor film, the impurity semiconductor film, and the second conductive film with use of the first resist mask to expose at least a surface of the first conductive film; performing second etching on a part of the first conductive film to form a gate electrode layer in such a manner that a width of the gate electrode is narrower than a width of the first insulating film; forming a second resist mask by reducing the first resist mask in size to expose the second conductive film which overlaps with the recessed portion of the first resist mask; and performing third etching on the second conductive film, the impurity semiconductor film, and a part of the semiconductor film with use of the second resist mask to form a source and drain electrode layer, a source and drain region layer, and a semiconductor layer. Then, the second resist mask is removed. A second insulating film is formed to cover the thin film transistor. An opening is formed in the second insulating film so as to expose a part of the source and drain electrode layer. A first pixel electrode is selectively formed over the opening and the second insulating film. An EL layer is formed over the first pixel electrode. A second pixel electrode is formed over the EL layer.

An embodiment of the invention to be disclosed is a method for manufacturing an EL display device including the following steps. A thin film transistor is formed by sequentially stacking a first conductive film, a first insulating film, a semiconductor film, an impurity semiconductor film, and a second conductive film; forming a first resist mask having a recessed portion over the second conductive film; performing first etching on the first insulating film, the semiconductor film, the impurity semiconductor film, and the second conductive film with use of the first resist mask to expose at least a surface of the first conductive film; forming a second resist mask by reducing the first resist mask in size to expose the second conductive film which overlaps with the recessed portion of the first resist mask; after forming the second resist mask performing second etching on a part of the first conductive film to form a gate electrode layer in such a manner that a width of the gate electrode is narrower than a width of the first insulating film; and performing third etching on the second conductive film, the impurity semiconductor film, and a part of the semiconductor film with use of the second resist mask to form a source and drain electrode layer, a source and drain region, and a semiconductor layer. Then, the second resist mask is removed. A second insulating film is formed to cover the thin film transistor. An opening is formed in the second insulating film so as to expose a part of the source and drain electrode layer A first pixel electrode is selectively formed over the opening and the second insulating film. An EL layer is formed over the first pixel electrode. A second pixel electrode is formed over the EL layer.

In the case where the first resist mask has a recessed portion in the manufacturing methods having the above-described structures, it is preferable that the first resist mask be formed using a multi-tone mask. By using the multi-tone mask, a resist mask having a recessed portion can be formed by a simple process.

By employing the method for manufacturing an EL display device having any of the above-described structures, an element region is formed by the first etching, and a side surface of the gate electrode layer can be provided on an inner side than a side surface of the element region by an almost uniform distance by the second etching.

In any of the above-described methods for manufacturing an EL display device by using the first etching and the second etching, it is preferable that the first etching be dry etching and the second etching be wet etching. The processing by the first etching is preferably performed with high precision, and side etching needs to be performed in the processing by the second etching. This is because dry etching is preferable for high-precision processing, and side etching is more likely to occur in wet etching which utilizes a chemical reaction than in dry etching.

In the above-described methods for manufacturing an EL display device, the second insulating film is preferably formed by stacking an insulating film formed by a CVD method or a sputtering method and an insulating film formed by a spin coat method. More preferably, the second insulating film is formed by stacking a silicon nitride film by a CVD method or a sputtering method and an organic resin film by a spin coat method. By formation of the second insulating film in such a manner, the thin film transistor can be protected from an impurity element or the like which may adversely affect electric characteristics of the thin film transistor, and planarity of a surface over which the pixel electrode is formed can be improved; accordingly, reduction in yield can be prevented.

A thin film transistor formed by employing any of the above-described methods for manufacturing an EL display device includes a gate insulating film which covers a gate electrode layer, a semiconductor layer over the gate insulating film, a source and drain region over the semiconductor layer, a source and drain electrode over the source and drain region, and a cavity adjacent to a side surface of the gate electrode layer. The vicinity of an end of the gate electrode can have a lower dielectric constant (low-k) by providing the cavity.

Note that a "film" indicates one formed over a whole surface without being formed into a pattern, and a "layer" indicates one which has been formed into a pattern with a desired shape using a resist mask or the like. However, as for each layer of stacked films, a "film" and a "layer" are used in an indistinguishable manner in some cases.

Note that etching is preferably performed on such conditions as to cause unintended etching as little as possible.

Note that in this specification, "having heat resistance" of the given film indicates that a form of the film can be kept by temperature in the later step and functions and characteristics which are required for the film can be kept.

Note that a "gate wiring" indicates a wiring connected to a gate electrode of a thin film transistor. The gate wiring is formed using a gate electrode layer. Further, the gate wiring is sometimes referred to as a scanning line.

Note that a "source wiring" indicates a wiring connected to one of a source electrode and a drain electrode of a thin film transistor. The source wiring is formed using a source and drain electrode layer. Further, the source wiring is sometimes referred to as a signal line.

Further, a "power supply line" indicates a wiring connected to a power supply and retained at a certain potential.

It is not necessary that a photomask used for formation of a pattern of a gate electrode be newly formed, and thus, the number of manufacturing steps of a thin film transistor can be significantly reduced. Such a transistor can be applied to an EL display device. Therefore, the number of manufacturing steps of the EL display device can be significantly reduced.

More specifically, the number of photomasks can be reduced. It is possible to form a thin film transistor by using only one photomask (a multi-tone mask). Accordingly, the number of manufacturing steps of the EL display device can be significantly reduced.

Further, a complicated step such as backside light exposure, resist reflow a lift-off method, or the like is not needed unlike the conventional technique which is aimed at reducing the number of photomasks. Therefore, the number of manufacturing steps of the EL display device can be significantly reduced without reducing yield.

In the conventional technique, the number of photomasks is reduced at the cost of electric characteristics. However, in one embodiment of the invention, the number of manufacturing steps of a thin film transistor can be significantly reduced while keeping electric characteristics of the thin film transistor. Therefore, the number of manufacturing steps of an EL display device can be significantly reduced without degrading display quality and the like of the EL display device.

Furthermore, in accordance with the above effect, the manufacturing cost of the EL display device can be significantly reduced. Note that the thin film transistor manufactured by the method of one embodiment of the invention has a cavity adjacent to an end of a gate electrode layer; thus, leak current generated between a gate electrode and a drain electrode is small.

DETAILED DESCRIPTION OF THE INVENTION

Figure 1:
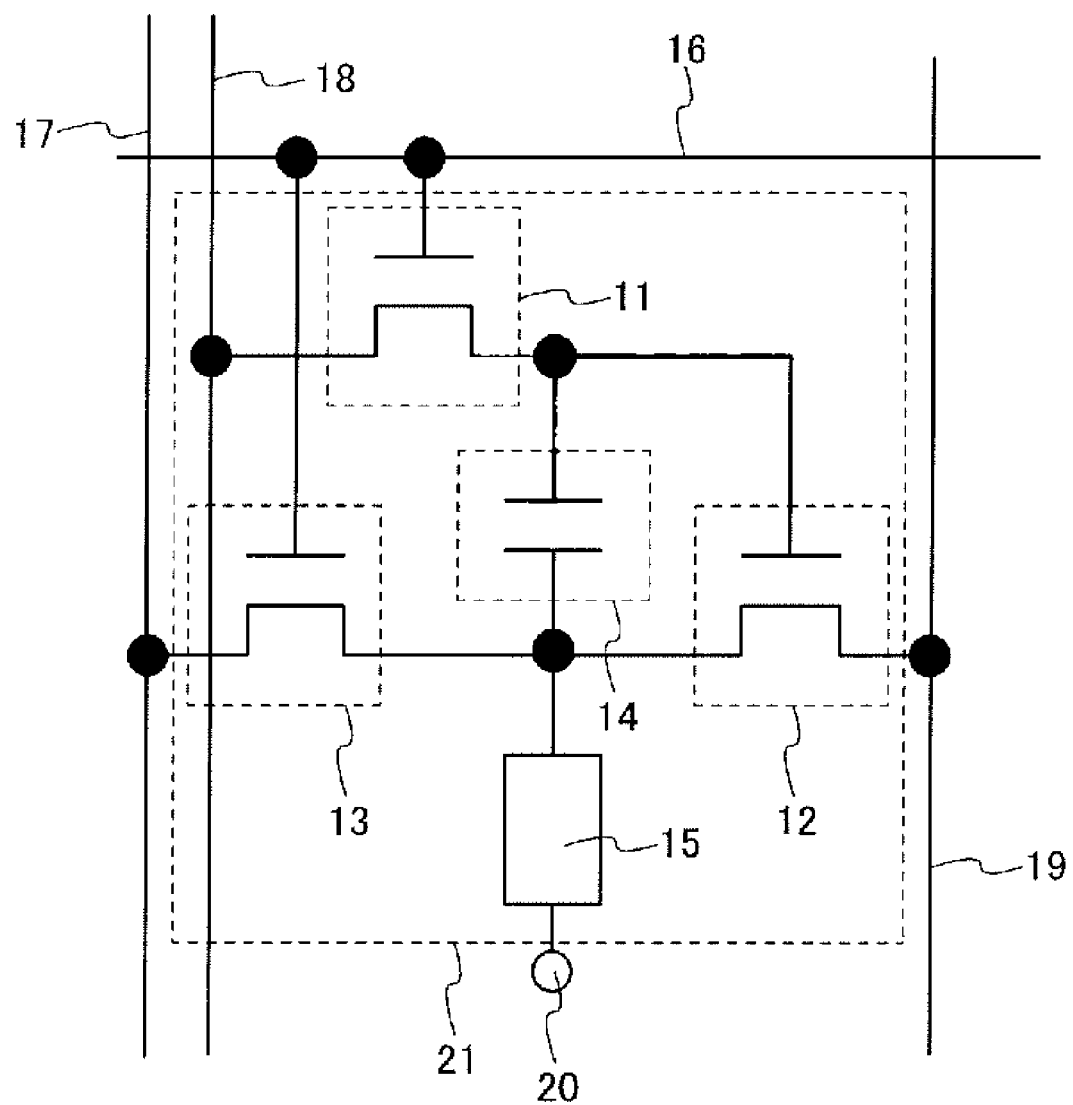
FIG. 1 illustrates an example of a pixel circuit of a display device.
Figure 2:
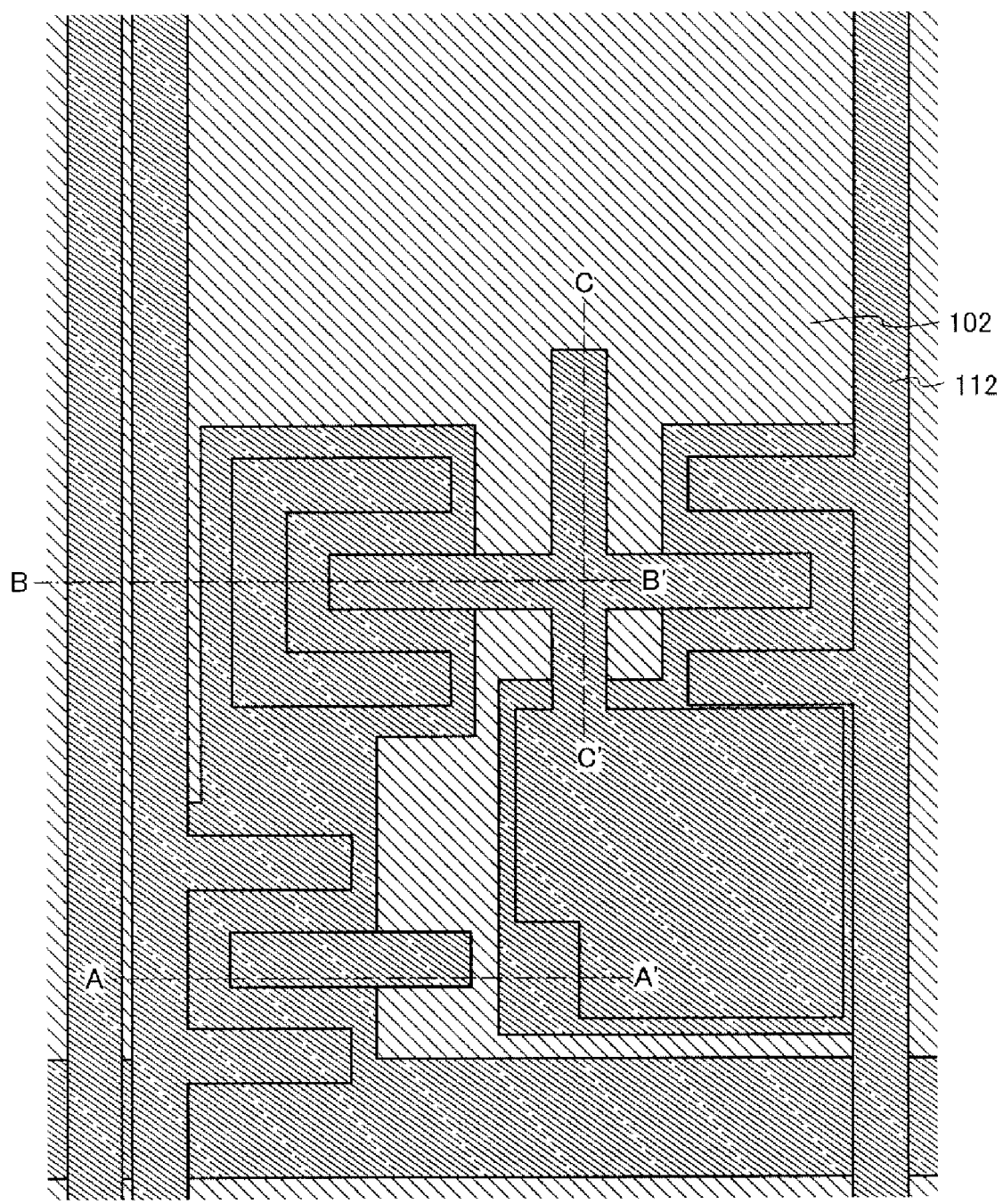
FIG. 2 illustrates an example of a method for manufacturing a thin film transistor and a display device.

Embodiments of the invention will be described in detail with reference to the drawings. However, the invention is not limited to description below. It is easily understood by those skilled in the art that the mode and detail can be variously changed unless departing from the scope and spirit of the invention. Hence, the present invention should not be limited to interpret to the description of the following embodiment modes. On the description of the invention with reference to the drawings, a reference numeral indicating the same part is used in common throughout different drawings. The same hatching pattern is applied to similar parts, and the similar parts are not especially denoted by reference numerals in some cases. Further, an insulating film" is not illustrated on top views.

Embodiment 1

In this embodiment, an example of a method for manufacturing a thin film transistor and a method for manufacturing an EL display device in which the thin film transistors are arranged in matrix will be described with reference to FIGS. 1 to 16(B-2).

A variety of pixel circuits of an EL display device (an active EL display device) in which thin film transistors are used as switching elements are examined. In this embodiment, an example of a simple pixel circuit is illustrated in FIG. 1, and a manufacturing method of a pixel structure to which this pixel circuit is applied is described. However, a pixel circuit of an EL display device to be disclosed is not limited to the structure illustrated in FIG. 1.

In a pixel structure of an EL display device illustrated in FIG. 1, a pixel 21 includes a first transistor 11, a second transistor 12, a third transistor 13, a capacitor 14, and a light-emitting element 15. Each of the first to third transistors is an n-channel transistor. A gate electrode of the first transistor 11 is connected to a gate wiring 16, one (a first electrode) of a source electrode and a drain electrode is connected to a source wiring 18, and the other electrode (a second electrode) is connected to a gate electrode of the second transistor 12 and one (a first electrode) of electrodes of the capacitor 14. The other electrode (a second electrode) of the capacitor 14 is connected to one (a first electrode) of a source electrode and a drain electrode of the second transistor 12, one (a first electrode) of a source electrode and a drain electrode of the third transistor 13, and one (a first electrode) of the light-emitting element 15. The other electrode (a second electrode) of the second transistor 12 is connected to a second power supply line 19. The other electrode (a second electrode) of the third transistor 13 is connected to a first power supply line 17, and a gate electrode of the third transistor 13 is connected to the gate wiring 16. The other electrode (a second electrode) of the light-emitting element 15 is connected to a common electrode 20. Note that potential of the first power supply line 17 and potential of the second power supply line 19 are different from each other.

Operation of the pixel 21 is described. When the third transistor 13 is turned on by a signal from the gate wiring 16, each potential of the first electrode of the second transistor 12, the first electrode of the light-emitting element 15, and the second electrode of the capacitor 14 is equal to potential ($V_{17}$) of the first power supply line 17. Here, the potential ($V_{17}$) of the first power supply line 17 is fixed at a constant potential; thus, each potential of the first electrode of the second transistor 12, the first electrode of the light-emitting element 15, and the second electrode of the capacitor 14 is constant potential ($V_{17}$).

When the first transistor 11 is selected and turned on by the signal from the gate wiring 16, potential ($V_{18}$) of a signal from the source wiring 18 is input to the gate electrode of the second transistor 12 via the first transistor 11. At this time, in the case where potential ($V_{19}$) of the second power supply line 19 is higher than the potential ($V_{17}$) of the first power supply line 17, the relation of $V_{gs} = V_{18} - V_{17}$ is satisfied. When $V_{gs}$ is higher than the threshold voltage of the second transistor 12, the second transistor 12 is turned on.

Accordingly, when the second transistor 12 is made to operate in a linear region, by changing the potential ($V_{18}$) of the source wiring 18 (e.g., between binary values), the second transistor 12 can be controlled to be turned on or off. That is, whether or not voltage is applied to an EL layer included in the light-emitting element 15 can be controlled.

Further, when the second transistor 12 is made to operate in a saturation region, by changing the potential ($V_{18}$) of the source wiring 18, the amount of current flowing through the light-emitting element 15 can be controlled.

In the case where the second transistor 12 is made to operate in a linear region in a manner described above, whether or not voltage is applied to the light-emitting element 15 can be controlled, and the light-emitting state and non-light-emitting state of the light-emitting element 15 can be controlled. Such a driving method can be used for, for example, digital time gray scale driving. The digital time gray scale driving is a driving method by which one frame is divided into a plurality of subframes and the light-emitting and non-light-emitting state of the light-emitting element 15 is controlled in each subframe. In the case where the second transistor 12 is made to operate in a saturation region, the amount of current flowing through the light-emitting element 15 can be controlled, and luminance of the light-emitting element can be adjusted.

Next, a pixel structure in which the pixel circuit illustrated in FIG. 1 is employed and a manufacturing method thereof are described below.

Figure 6:
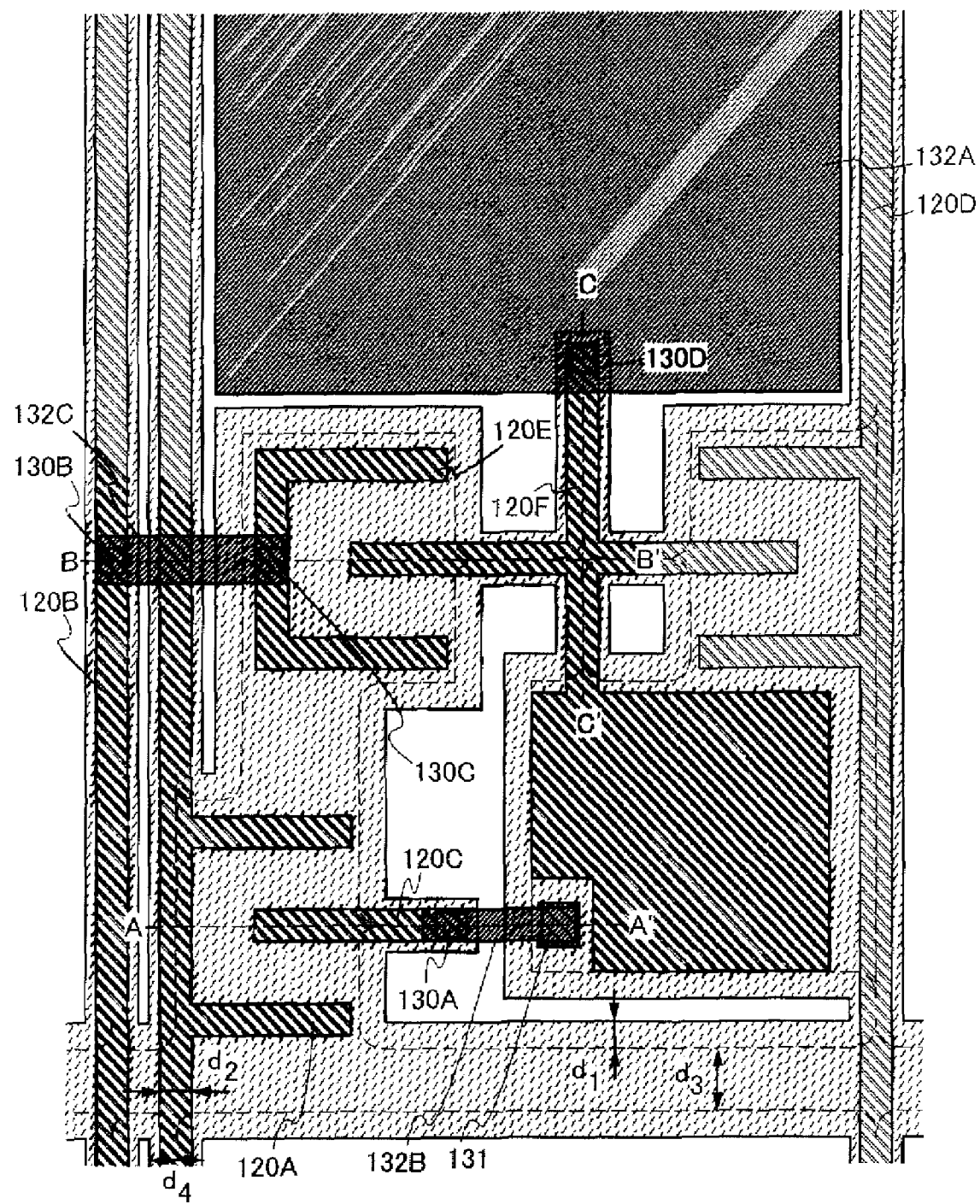
FIG. 6 illustrates an example of a method for manufacturing a thin film transistor and a display device.

FIG. 2, FIG. 3, FIG. 4, FIG. 5, and FIG. 6 are top views of a thin film transistor of this embodiment, and additionally, FIG. 6 is a completion view illustrating the thin film transistor in which components up to a pixel electrode have been formed. FIGS. 7A to 7C, FIGS. 8A to 8C, and FIGS. 9A to 9C are cross-sectional views taken along a line A-A' of FIG. 2, FIG. 3, FIG. 4, FIG. 5, and FIG. 6. FIGS. 10A to 10C, FIGS. 11A to 11C, and FIGS. 12A to 12C are cross-sectional views taken along a line B-B' of FIG. 2, FIG. 3, FIG. 4, FIG. 5, and FIG. 6. FIGS. 13A to 13C, FIGS. 14A to 14C, and FIGS. 15A to 15C are cross-sectional views taken along a line C-C' of FIG. 2, FIG. 3, FIG. 4, FIG. 5, and FIG. 6.

First, over a substrate 100, a first conductive film 102, a first insulating film 104, a semiconductor film 106, an impurity semiconductor film 108, and a second conductive film 110 are formed. Each of these films may be formed with a single layer or a layered film in which a plurality of films are stacked.

The substrate 100 is an insulating substrate, and for example, a glass substrate or a quartz substrate can be used. In this embodiment, a glass substrate is used.

The first conductive film 102 is formed of a conductive material. The first conductive film 102 can be formed using a conductive material such as a metal material, e.g., titanium, molybdenum, chromium, tantalum, tungsten, aluminum, copper, neodymium, niobium, or scandium, or an alloy material including any of these metal materials as a main component. The first conductive film 102 needs such heat resistance as to withstand a later step (formation of the insulating film 104 or the like), and a material which is not unintentionally etched or eroded in a later step (etching of the second conductive film 110 or the like) needs to be selected for the first conductive film 102. Only in these conditions, the material of the first conductive film 102 is not limited to a particular material.

Note that the first conductive film 102 can be formed by, for example, a sputtering method, a CVD method (including a thermal CVD method, a plasma CVD method, and the like), or the like. However, the formation method of the first conductive film 102 is not limited to a particular method.

The first insulating film 104 is formed of an insulating material. The first insulating film 104 can be formed using, for example, a silicon oxide film, a silicon nitride film, a silicon oxynitride film, a silicon nitride oxide film, or the like. Similarly to the first conductive film 102, the first insulating film 104 needs heat resistance, and a material which is not unintentionally etched or eroded in a later step needs to be selected for the first insulating film 104. Only in these conditions, the material of the first insulating film 104 is not limited to a particular material.

Note that the first insulating film 104 can be formed by, for example, a CVD method (including a thermal CVD method, a plasma CVD method, and the like), a sputtering method, or the like; however, the formation method of the first insulating film 104 is not limited to a particular method.

The first insulating film 104 serves as a gate insulating film.

The semiconductor film 106 is formed of a semiconductor material. The semiconductor film 106 can be formed using, for example, amorphous silicon formed using a silane gas or the like. Similarly to the first conductive film 102 and the like, the semiconductor film 106 needs heat resistance, and a material which is not unintentionally etched or eroded in a later step needs to be selected for the semiconductor film 106. Only in these conditions, the material of the semiconductor film 106 is not limited to a particular material. Accordingly, germanium or the like may be used.

Note that the semiconductor film 106 can be formed by, for example, a CVD method (including a thermal CVD method, a plasma CVD method, and the like), a sputtering method, or the like. However, the formation method of the semiconductor film 106 is not limited to a particular method.

The semiconductor film 106 is preferably formed with a layered film of a crystalline semiconductor film and an amorphous semiconductor film. As the crystalline semiconductor film, a polycrystalline semiconductor film, a microcrystalline semiconductor film, or the like can be given.

A polycrystalline semiconductor film is a semiconductor film which includes crystal grains provided with many grain boundaries between crystal grains. The polycrystalline semiconductor film is formed by, for example, a thermal crystallization method or a laser crystallization method. Here, a thermal crystallization method is a crystallization method by which an amorphous semiconductor film is formed over a substrate and the substrate is heated, so that the amorphous semiconductor is crystallized. Further, a laser crystallization method is a crystallization method by which an amorphous semiconductor film is formed over a substrate and the amorphous semiconductor film is directly irradiated with a laser, so that the amorphous semiconductor is crystallized. Alternatively, a crystallization method by which an element for promoting crystallization such as nickel is added to an amorphous semiconductor film to crystallize the amorphous semiconductor may be used. In the case of crystallization by adding an element for promoting crystallization, it is preferable that the semiconductor film be irradiated with a laser.

The polycrystalline semiconductors are classified into LTPS (low temperature polysilicon) which is crystallized at such temperature for such time that a glass substrate is not distorted and HTPS (high temperature polysilicon) which is crystallized at higher temperature.

The microcrystalline semiconductor film is a semiconductor film including crystal grains whose grain size is approximately 2 to 100 nm inclusive, and includes a semiconductor film whose whole surface is formed with only crystal grains or a semiconductor film in which amorphous semiconductor is interposed between crystal grains. As for a formation method of the microcrystalline semiconductor film, the following method may be used: a method in which crystal nuclei are formed and grown; a method in which an amorphous semiconductor film is formed, an insulating film is formed to have contact with the amorphous semiconductor film, a metal film is formed thereover, and the metal film is irradiated with a laser, so that the amorphous semiconductor is crystallized by heat generated in the metal film; or the like. However, the microcrystalline semiconductor film does not include a crystalline semiconductor film which is formed by performing a thermal crystallization method or a laser crystallization method on an amorphous semiconductor film.

In the case where a layered film in which an amorphous semiconductor film is formed over a crystalline semiconductor film is, for example, used as the semiconductor film 106, transistors included in a pixel circuit of an EL display device can be made to operate at high speed. Here, either a polycrystalline semiconductor (including LTPS and HTPS) film or a microcrystalline semiconductor film may be used for the crystalline semiconductor film.

By forming the amorphous semiconductor film over the crystalline semiconductor film, a surface of a crystalline semiconductor film can be prevented from being oxidized. In addition, withstand voltage can be improved, and off current can be reduced.

There is no particular limitation on crystallinity of the semiconductor film 106 as long as the pixel circuit of the EL display device operates normally.

The impurity semiconductor film 108 is a semiconductor film containing an impurity element imparting one conductivity type, and is formed using a semiconductor material gas to which the impurity element imparting one conductivity type is added or the like. Since an n-channel thin film transistor is formed in this embodiment, for example, the impurity semiconductor film 108 may be formed of a silicon film containing phosphorus which is formed using a silane gas containing phosphine (chemical formula: $PH_3$). Similarly to the first conductive film 102 and the like, the impurity semiconductor film 108 needs heat resistance, and a material which is not unintentionally etched or eroded in a later step needs to be selected for the impurity semiconductor film 108. Only in these conditions, the material of the impurity semiconductor film 108 is not limited to a particular material. Note that there is no particular limitation on crystallinity of the impurity semiconductor film 108 as well. Alternatively, in the case where a region where ohmic contact can be formed is provided at part of a semiconductor layer formed of the semiconductor film 106 by doping or the like, it is not necessary to provide the impurity semiconductor film 108.

In this embodiment, since an n-channel thin film transistor is formed, arsenic or the like may be used as the impurity element imparting one conductivity type to be added, and arsine (chemical formula: $AsH_3$) may be contained at the predetermined concentration in a silane gas used for formation.

The impurity semiconductor film 108 can be formed by, for example, a CVD method (including a thermal CVD method, a plasma CVD method, and the like), or the like. However, the formation method of the impurity semiconductor film 108 is not limited to a particular method.

The second conductive film 110 is formed of a conductive material (a material mentioned as the material of the first conductive film 102 and the like) but is different from the material used for the first conductive film 102. Here, the "different material" means a material having a different main component. Specifically, a material which is not easily etched by second etching which is described later is preferably selected. Further, similarly to the first conductive film 102 and the like, the second conductive film 110 needs heat resistance, and a material which is not unintentionally etched and eroded in a later step needs to be selected for the second conductive film 110. Accordingly, only in these conditions, the material of the second conductive film 110 is not limited to a particular material.

The second conductive film 110 can be formed by, for example, a sputtering method, a CVD method (including a thermal CVD method, a plasma CVD method, and the like), or the like. However, the formation method of the second conductive film 110 is not limited to a particular method.

Among the first conductive film 102, the first insulating film 104, the semiconductor film 106, the impurity semiconductor film 108, and the second conductive film 110, each of which needs heat resistance, heat resistance of the first conductive film 102 is highest, which is followed by those of the first insulating film 104, the semiconductor film 106, the impurity semiconductor film 108, and the second conductive film 110 in this order; that is, heat resistance of the second conductive film 110 is lowest. For example, in the case where the semiconductor film 106 is an amorphous semiconductor film containing hydrogen, hydrogen in the semiconductor film is desorbed at about 300° C. or higher, so that electric characteristics are changed. Thus, it is preferable that temperature be set below 300° C., for example, in later steps after the semiconductor film 106 has been formed.

Figure 7A:
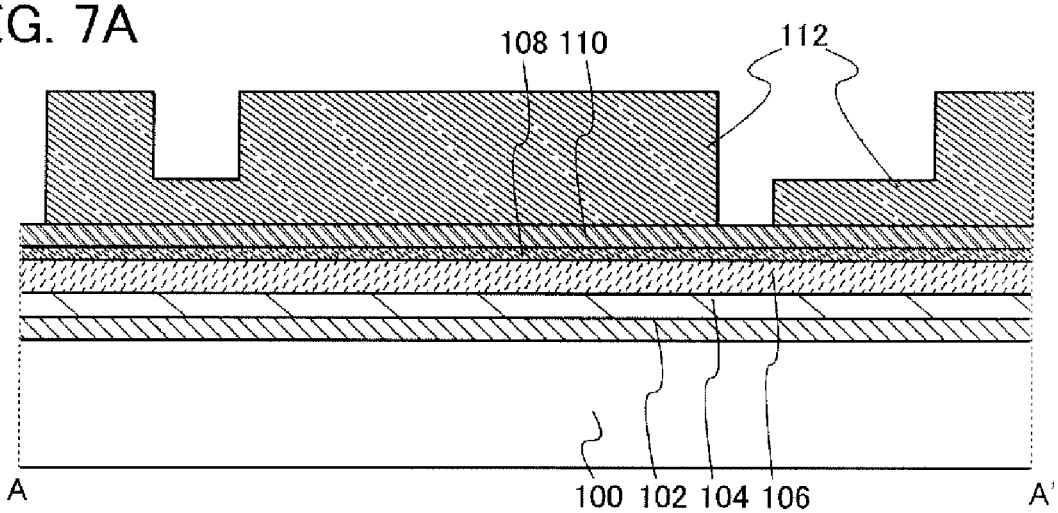
FIGS. 7A to 7C illustrate an example of a method for manufacturing a thin film transistor and a display device.
Figure 7B:
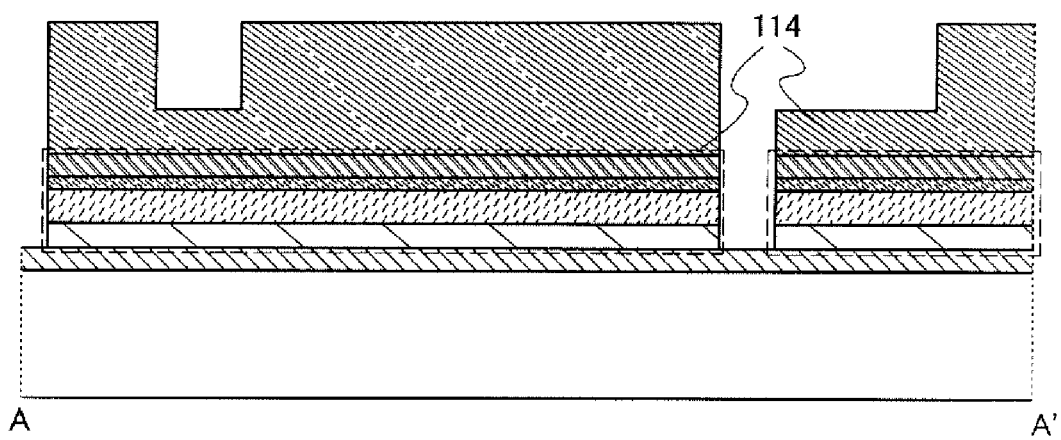
Figure 7C:
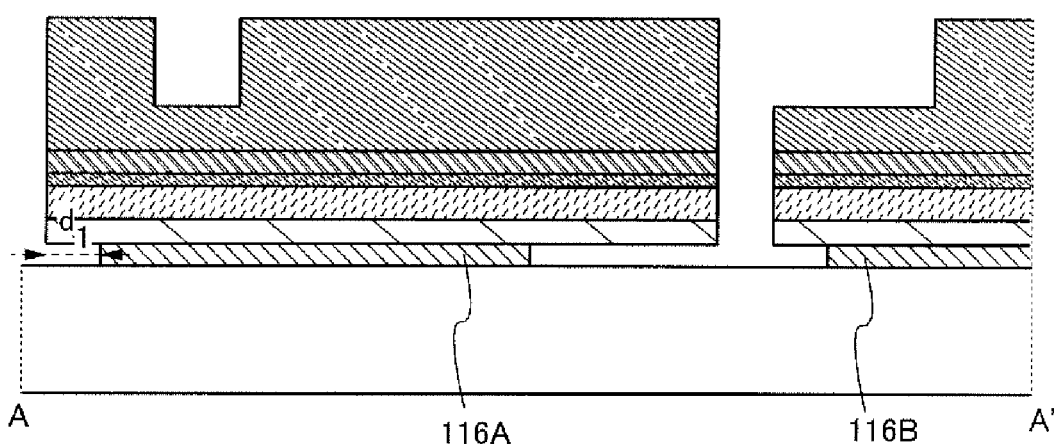
Figure 10A:
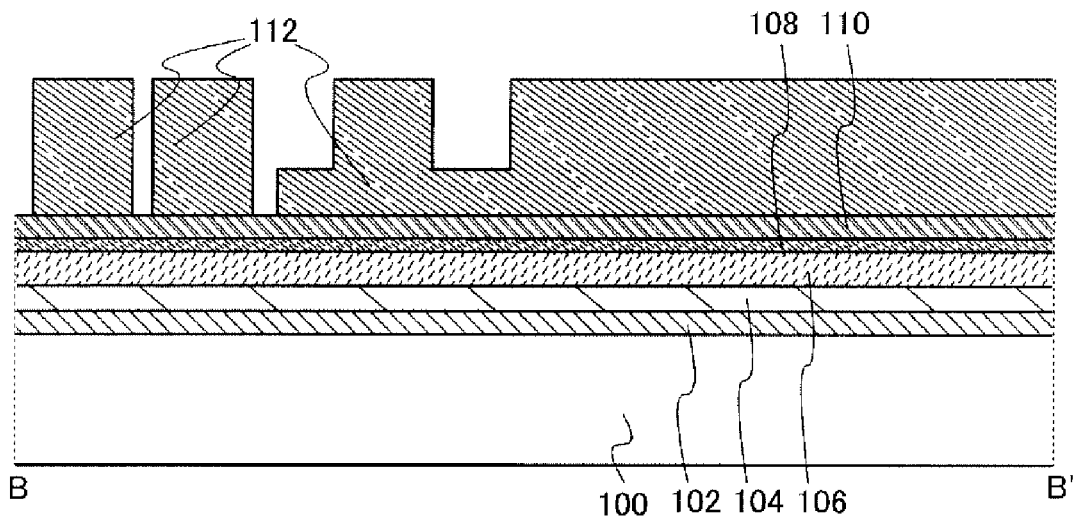
FIGS. 10A to 10C illustrate an example of a method for manufacturing a thin film transistor and a display device.
Figure 10B:
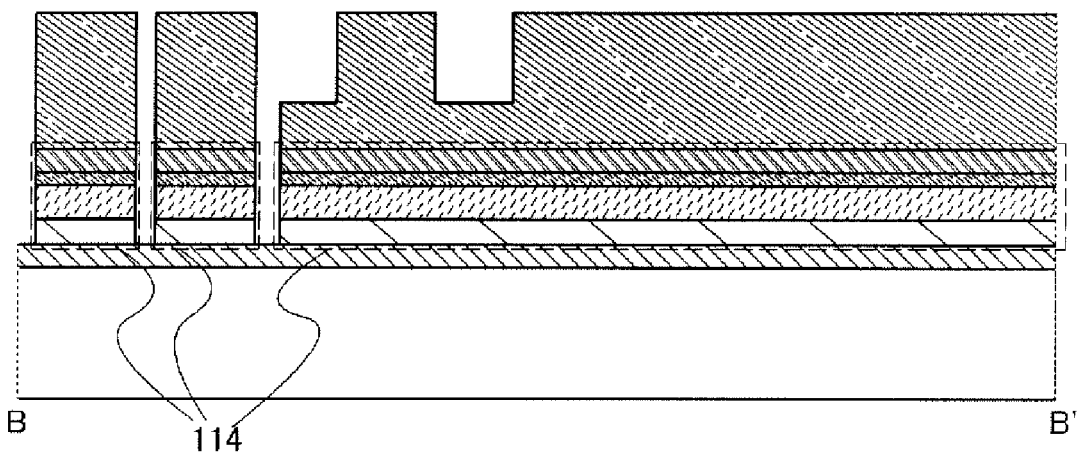
Figure 10C:
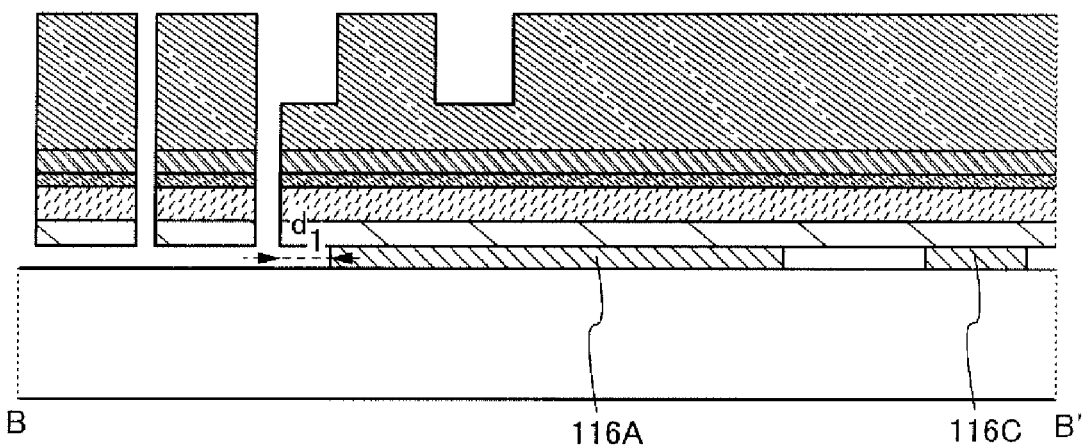
Figure 11A:
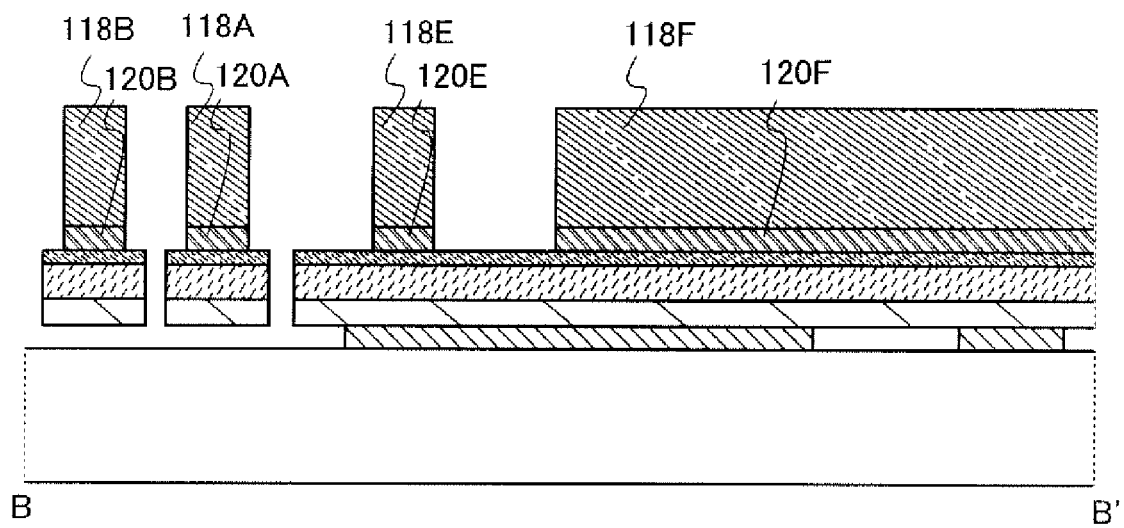
FIGS. 11A to 11C illustrate an example of a method for manufacturing a thin film transistor and a display device.
Figure 11B:
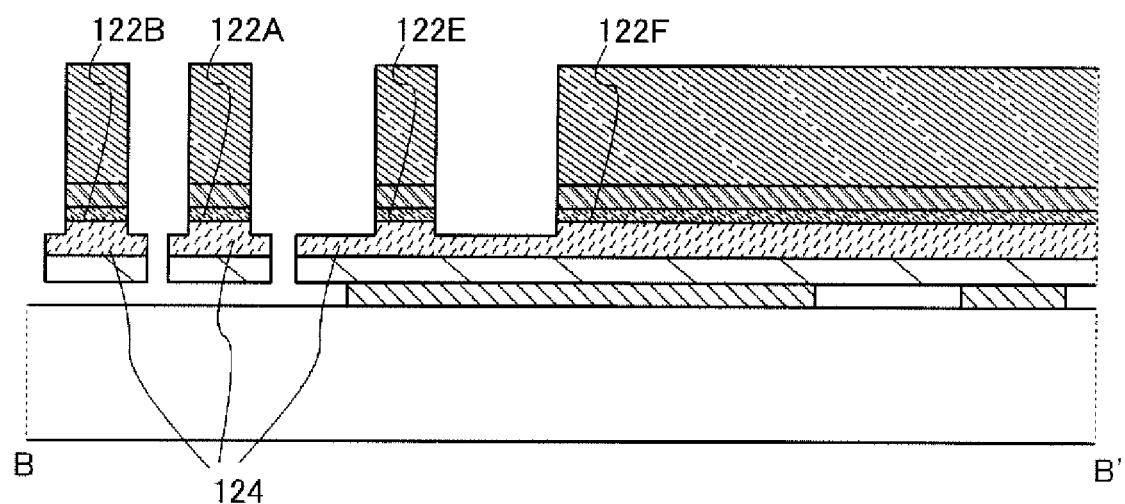
Figure 11C:
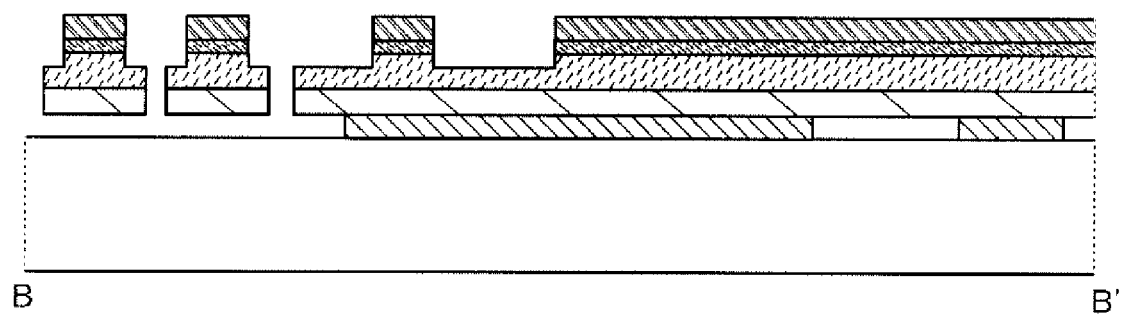
Figure 13A:
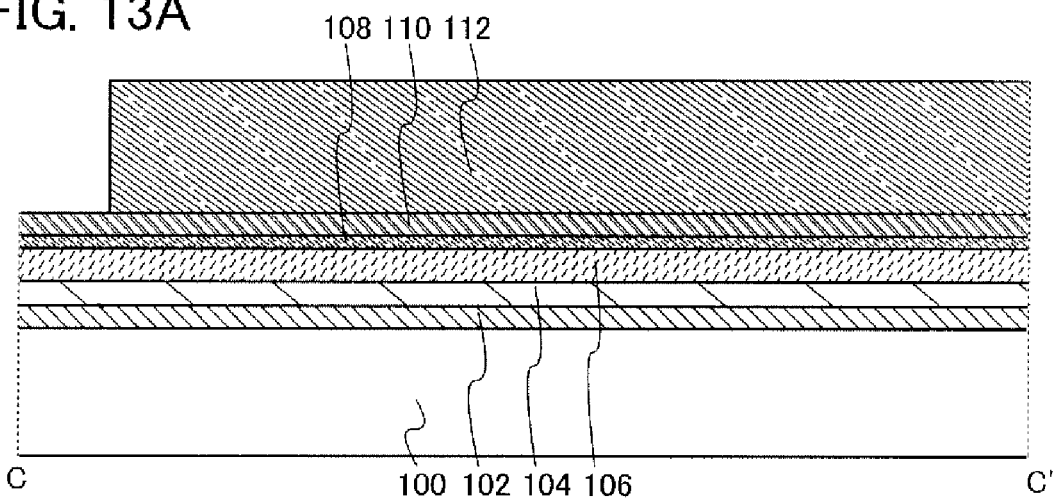
FIGS. 13A to 13C illustrate an example of a method for manufacturing a thin film transistor and a display device.
Figure 13B:
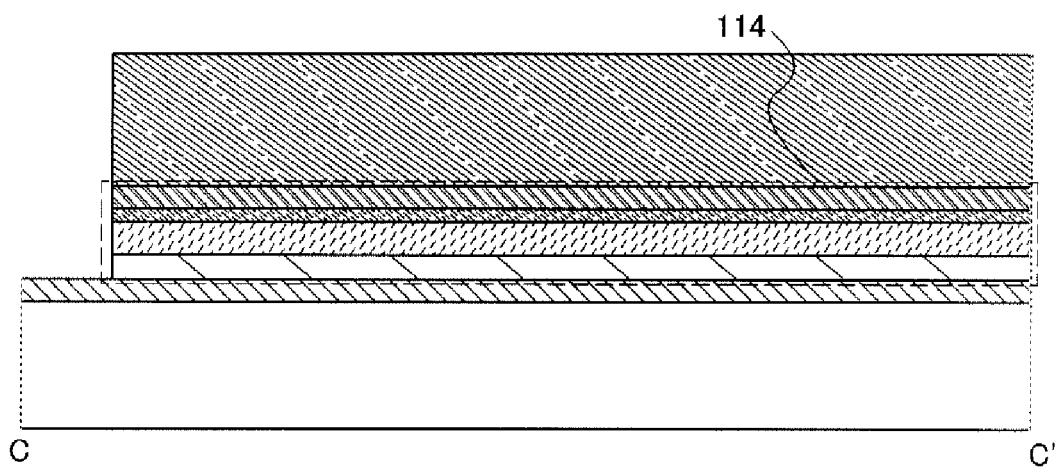
Figure 13C:
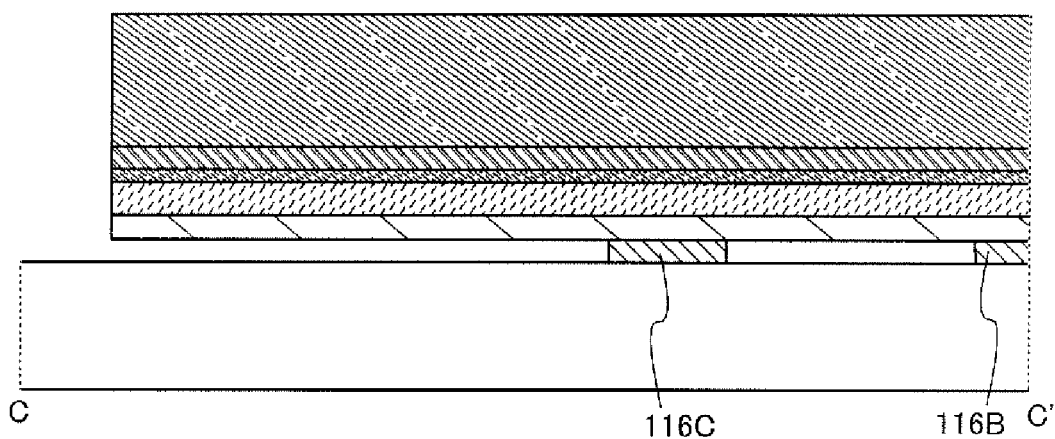
Figure 14A:
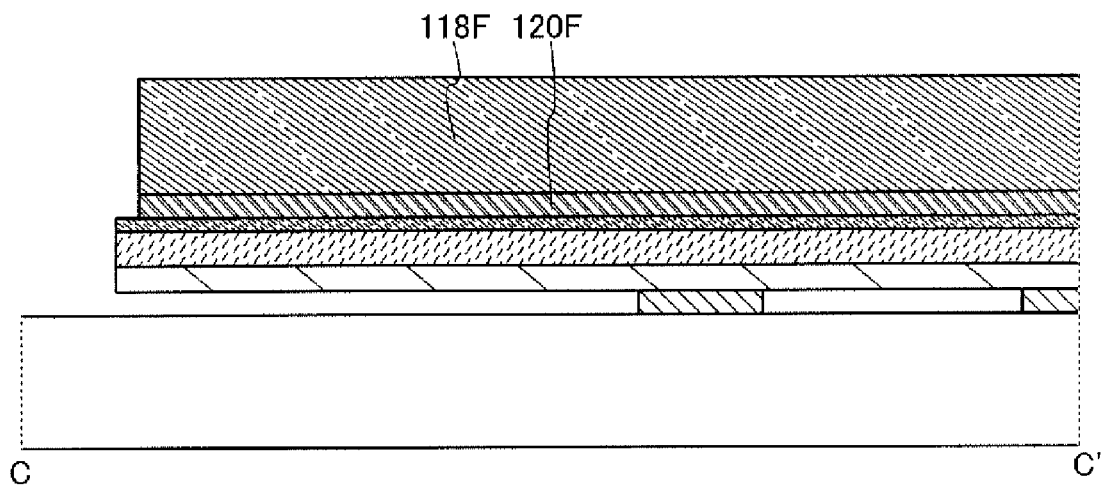
FIGS. 14A to 14C illustrate an example of a method for manufacturing a thin film transistor and a display device.
Figure 14B:
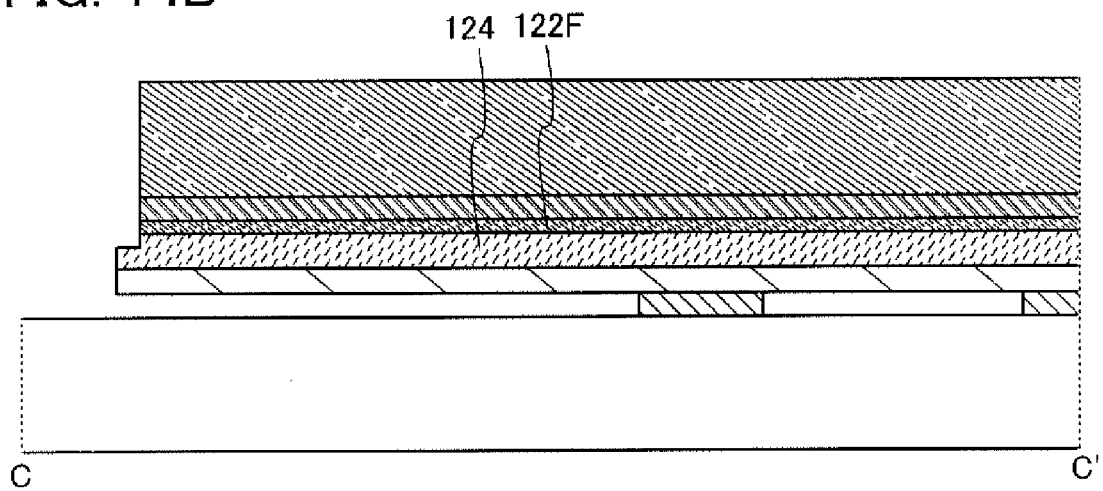
Figure 14C:
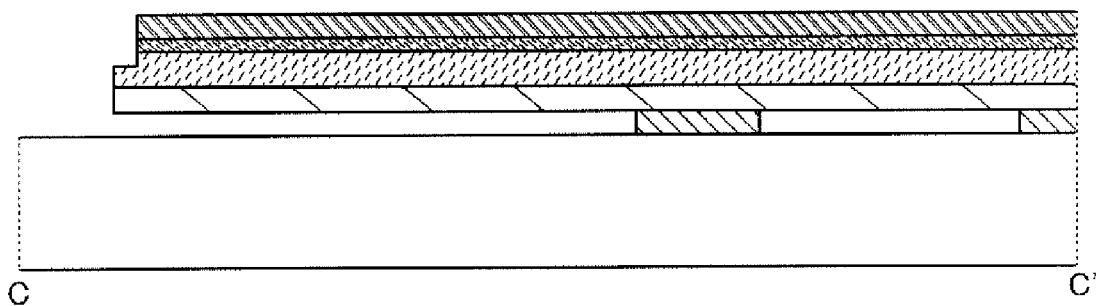

Next, a first resist mask 112 is formed over the second conductive film 110 (see FIG. 7A, FIG. 10A, and FIG. 13A). Here, it is preferable that the first resist mask 112 have a recessed portion or a projected portion. In other words, the resist mask 112 includes a plurality of regions (here, two regions) with different thicknesses. In the first resist mask 112, the thick region is referred to as a projected portion of the first resist mask 112 and the thin region is referred to as a recessed portion of the first resist mask 112. However, the resist mask is not limited thereto, and a resist mask which is not provided with a recessed portion or a projected portion may be used.

In the first resist mask 112, the projected portion is formed at a region where a source and drain electrode layer is formed, and the recessed portion is formed at a region where a semiconductor layer is exposed without existence of the source and drain electrode layer.

The first resist mask 112 can be formed using a multi-tone mask. Here, multi-tone masks will be described with reference to FIGS. 16(A-1) to (B-2).

A multi-tone mask is a mask capable of light exposure with multi-level light intensity, and typically, light exposure is performed with three levels of light intensity to provide an exposed region, a half-exposed region, and an unexposed region. With use of the multi-tone mask, one-time exposure and development process allows a resist mask with plural thicknesses (typically, two kinds of thicknesses) to be formed. Thus, the use of a multi-tone photomask enables the number of photomasks to be reduced.

Figure 16:
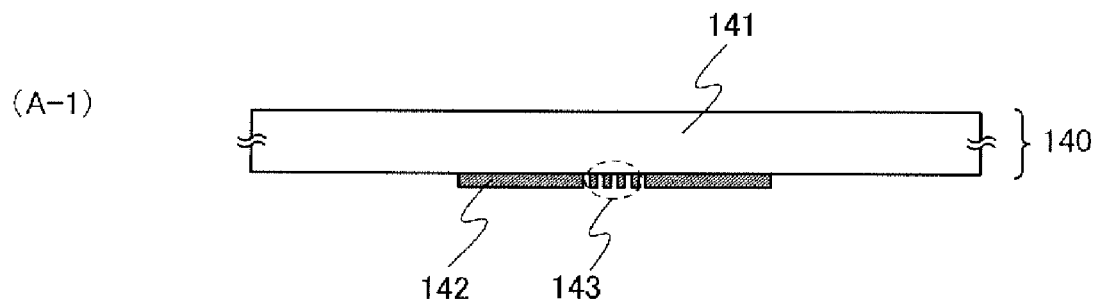
FIGS. 16(A-1) and 16(A-2) and FIGS. 16(B-1) and 16(B-2) each illustrate a multi-tone mask.
Figure 16:
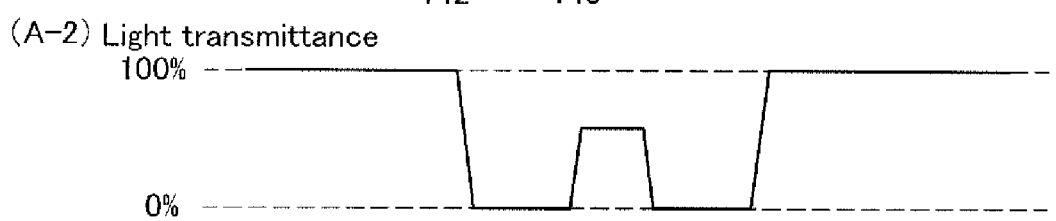
Figure 16:
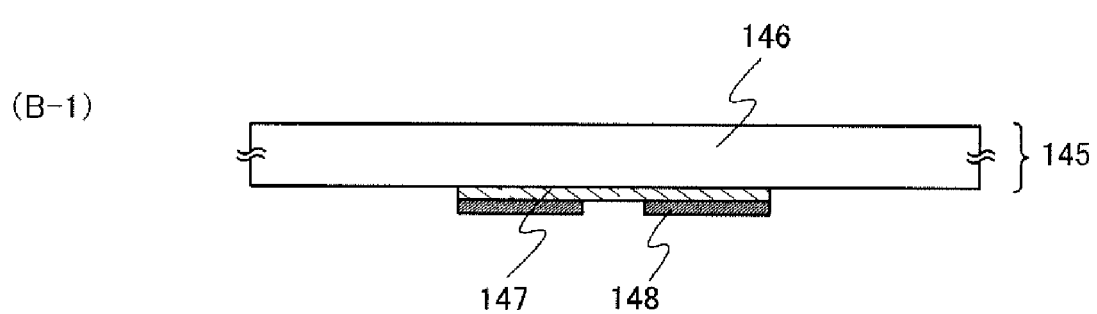
Figure 16:
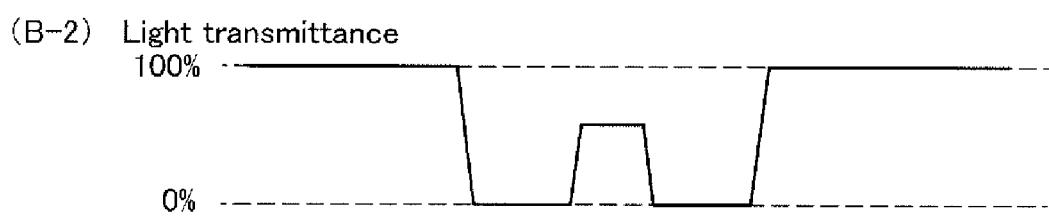

FIGS. 16(A-1) and 16(B-1) are cross-sectional views of typical multi-tone photomasks. The former shows a gray-tone mask 140 and the latter shows a half-tone mask 145.

The gray-tone mask 140 illustrated in FIG. 16(A-1) includes a light-blocking portion 142 formed of a light-blocking film on a substrate 141 having a light-transmitting property, and a diffraction grating portion 143 provided with a pattern of the light-blocking film.

The transmittance of light is controlled at the diffraction grating portion 143 in such a manner that slits, dots, mesh, or the like are provided at an interval equal to or less than the resolution limit of light used for light exposure. Note that the slits, dots, or mesh provided at the diffraction grating portion 143 may be provided regularly or irregularly.

As the substrate 141 having a light-transmitting property, quartz or the like can be used. The light-blocking film for forming the light-blocking portion 142 and the diffraction grating portion 143 may be formed using a metal film and preferably provided using chromium, chromium oxide, or the like.

In the case where the gray-tone mask 140 is irradiated with light for light exposure, as illustrated in FIG. 16(A-2), the transmittance in the region overlapping with the light-blocking portion 142 is 0%, and the transmittance in the region where both the light-blocking portion 142 and the diffraction grating portion 143 are not provided is 100%. Further, the transmittance at the diffraction grating portion 143 is basically in the range of 10% to 70%, which can be adjusted by the interval of slits, dots, or mesh at the diffraction grating, or the like.

The half-tone mask 145 illustrated in FIG. 16(B-1) includes a semi-light-transmitting portion 147 formed of a semi-light-transmitting film, and a light-blocking portion 148 formed of a light-blocking film on a substrate 146 having a light-transmitting property.

The semi-light-transmitting portion 147 can be formed using a film of MoSiN, MoSi, MoSiO, MoSiON, CrSi, or the like. The light-blocking portion 148 may be formed using a metal film in a manner similar to the light-blocking film of the gray-tone mask and is preferably formed using chromium, chromium oxide, or the like.

In the case where the half-tone mask 145 is irradiated with light for light exposure, as illustrated in FIG. 16(B-2), the transmittance in the region overlapping with the light-blocking portion 148 is 0%, and the transmittance in the region where both the light-blocking portion 148 and the semi-light-transmitting portion 147 are not provided is 100%. Further, the transmittance in the semi-light-transmitting portion 147 is basically in the range of 10% to 70%, which can be adjusted by the kind, the thickness, or the like of the material to be formed.

By light exposure using the multi-tone mask and development, the first resist mask 112 which includes regions having different thicknesses can be formed.

However, a resist mask is not limited to the above, and the first resist mask may be formed without using a multi-tone mask. Further, as described above, a resist mask which is not provided with a recessed portion or a projected portion can also be used for the first resist mask.

Next, first etching is performed using the first resist mask 112. That is, the first insulating film 104, the semiconductor film 106, the impurity semiconductor film 108, and the second conductive film 110 are etched to form a pattern, so that a thin-film stack body 114 is formed (see FIG. 2, FIG. 7B, FIG. 10B, and FIG. 13B). At this time, at least a surface of the first conductive film 102 is preferably exposed. In this specification, this etching step is called "first etching." As the first etching, either dry etching or wet etching may be employed. Note that the first etching can be performed by one step when dry etching is employed as the first etching. On the other hand, the first etching is preferably performed by plural steps when wet etching is employed as the first etching. This is because the etching rate varies depending on the kind of etched film and it is difficult to perform the etching by one step.

The first etching may be performed by, for example, dry etching composed of three stages. A mixed gas of a $Cl_2$ gas, a $CF_4$ gas, and an $O_2$ gas is used for the first stage of the first etching. Then, only a $Cl_2$ gas is used for the second stage, and only a $CHF_3$ gas is used for the third stage.

Next, second etching is performed using the first resist mask 112. That is, the first conductive film 102 is etched to form a gate electrode layer 116 (see FIG. 3, FIG. 7C, FIG. 10C, and FIG. 13C). In this specification, this etching step is called "second etching."

The gate electrode layer 116 forms a gate electrode of the thin film transistor, the gate wiring, one of electrodes of the capacitor, and a support. In this specification, when the gate electrode layer is referred to as a gate electrode layer 116A, it indicates an electrode layer for forming the gate wiring, the gate electrode of the first transistor 11, and the gate electrode of the third transistor 13. When the gate electrode layer is referred to as a gate electrode layer 116B, it indicates an electrode layer for forming the gate electrode of the second transistor 12 and one of electrodes of the capacitor 14. When the gate electrode layer is referred to as a gate electrode layer 116C, it indicates an electrode layer for forming the support. These are generically referred to as the gate electrode layer 116.

The second etching is performed on such etching conditions that a side surface of the gate electrode layer 116 formed from the first conductive film 102 is provided on the inner side than a side surface of the thin-film stack body 114. In other words, the second etching is performed so that the side surface of the gate electrode layer 116 can be formed to have contact with a bottom surface of the thin-film stack body 114 (the width of the gate electrode layer 116 is narrower than that of the thin-film stack body 114 in a cross section by the line A-A'). Further, the second etching is performed on such conditions that the etching rate with respect to the second conductive film 110 is low and the etching rate with respect to the first conductive film 102 is high. In other words, the second etching is performed on conditions that the etching selectivity of the first conductive film 102 with respect to the second conductive film 110 is high. By performing the second etching on such conditions, the gate electrode layer 116 can be formed.

There is no particular limitation on the shape of the side surface of the gate electrode layer 116. For example, the shape may be a tapered shape. The shape of the side surface of the gate electrode layer 116 is determined depending on the conditions such as a chemical used in the second etching.

Here, the phrase "the conditions that the etching rate with respect to the second conductive film 110 is low and the etching rate with respect to the first conductive film 102 is high" or "the conditions that the etching selectivity of the first conductive film 102 with respect to the second conductive film 110 is high" means conditions satisfying the following first requirement and second requirement.

The first requirement is that the gate electrode layer 116 is left in places where the gate electrode layer is needed. The places where the gate electrode layer 116 is needed are regions indicated by dotted lines in FIG. 3, FIG. 4, FIG. 5, and FIG. 6. That is, it is necessary that the gate electrode layer 116 is left so as to form the gate wiring, the gate electrodes of the transistors, and one of electrodes of the capacitor after the second etching. In order that the gate electrode layer forms the gate wiring, the second etching needs to be performed so as not to disconnect the wiring. As illustrated in FIG. 3 and FIGS. 7A to 7C, it is preferable to provide the side surface of the gate electrode layer 116 on the inner side than the side surface of the thin-film stack body 114 by a distance $d_1$, and the distance $d_1$ may be set as appropriate by a practitioner according to the layout.

The second requirement is that a minimum width $d_3$ and a minimum width $d_2$ have appropriate values, where the minimum width $d_3$ is a width of the gate wiring formed by the gate electrode layer 116, and the minimum width $d_2$ is a width of a source wiring formed by a source and drain electrode layer 120 and a power supply line (see FIG. 6). This is because as the source and drain electrode layer 120 is etched by the second etching, the minimum width $d_2$ of the source wiring and the power supply line is reduced; accordingly, the current density of the source wiring and the power supply line become excessive and electric characteristics are degraded. Therefore, the second etching is performed on the conditions that the etching rate of the first conductive film 102 is not too high and the etching rate of the second conductive film 110 is as low as possible.

It is difficult to increase the minimum width $d_2$ of the source wiring and the power supply line. This is because since the minimum width $d_2$ of the source wiring and the power supply line is determined by a minimum width $d_4$ of the semiconductor layer overlapping with the source wiring and the power supply line, and the minimum width $d_4$ of the semiconductor layer needs to be increased in order to increase the minimum width $d_2$ of the source wiring larger and the power supply line; accordingly, it becomes difficult to insulate the gate wirings which are adjacent to each other. The minimum width $d_4$ of the semiconductor layer is set smaller than about twice the distance $d_1$. In other words, the distance $d_1$ is set larger than about half the minimum width $d_4$ of the semiconductor layer.

A portion where the width of the semiconductor layer overlapping with the source wiring and the power supply line is the minimum width $d_4$ may be provided as appropriate for necessary places where the gate electrode layer is separated into elements. By the second etching, a pattern in which the gate electrode layer 116 is not left can be formed in a place overlapping with the portion where the width of the semiconductor layer is $d_4$.

In addition, the width of the electrode in a portion connected to a pixel electrode layer, which is formed of the source and drain electrode layer, be equal to the minimum width $d_2$ of the source wiring and the power supply line.

As described above, the second etching on the condition in which side etching is performed is very important. This is because by the second etching in which the first conductive film 102 is subjected to side etching, it is possible to form a pattern so that the desired connection of elements in the pixel circuit can be formed, as well as the gate wirings which are adjacent to each other and are formed of the gate electrode layer 116.

Here, "side etching" means etching by which a film is etched in not only a thickness direction of the film (a direction perpendicular to the substrate surface or a direction perpendicular to the surface of a base film of the film) but also in a direction perpendicular to the thickness direction (a direction parallel to the substrate surface or a direction parallel to the surface of the base film of the film). An end portion of the film subjected to side etching can have various shapes depending on the etching rate of an etching gas or a chemical used for the etching with respect to the film. The end portion of the film is, in many cases, formed with a curved surface.

Figure 3:
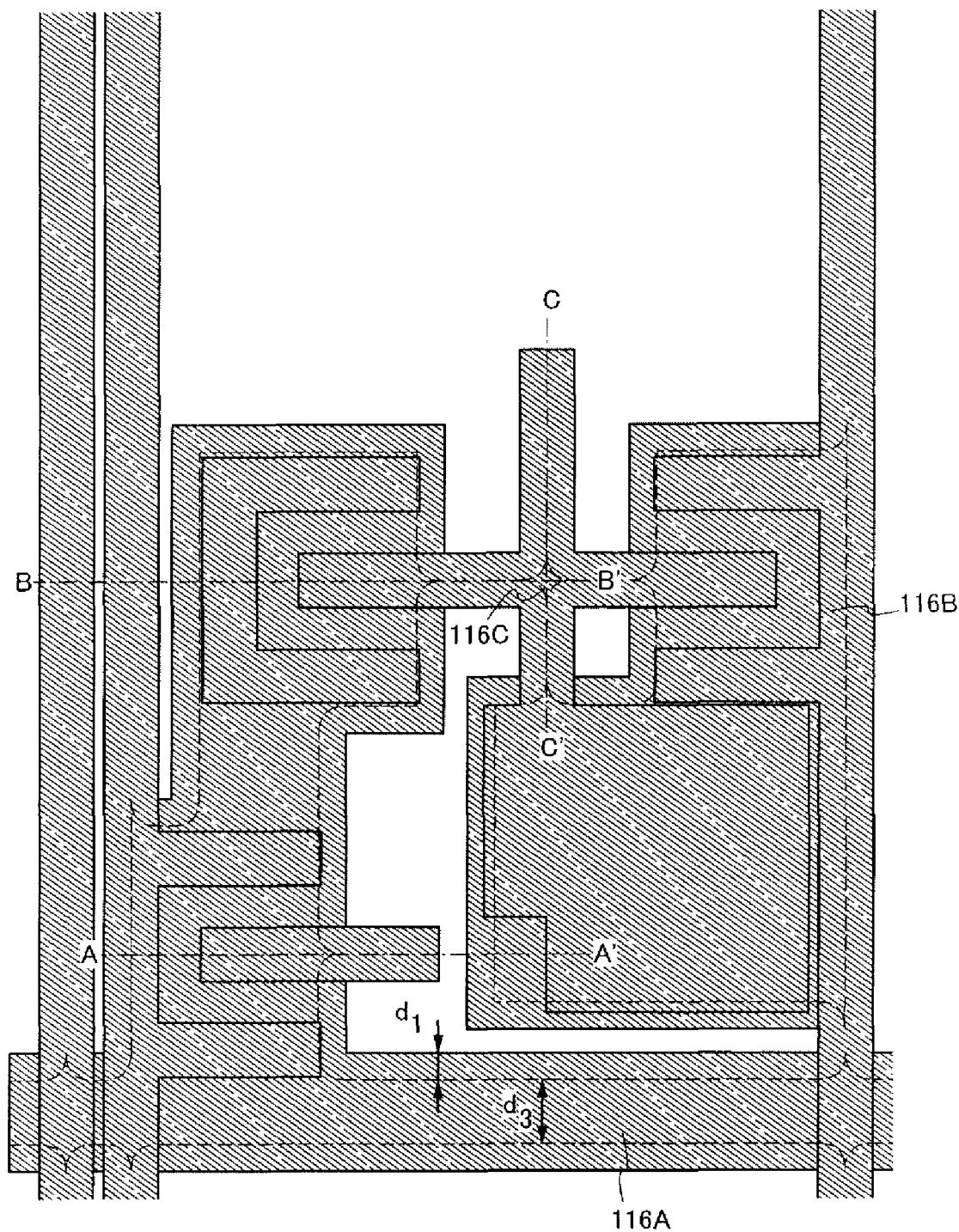
FIG. 3 illustrates an example of a method for manufacturing a thin film transistor and a display device.
Figure 4:
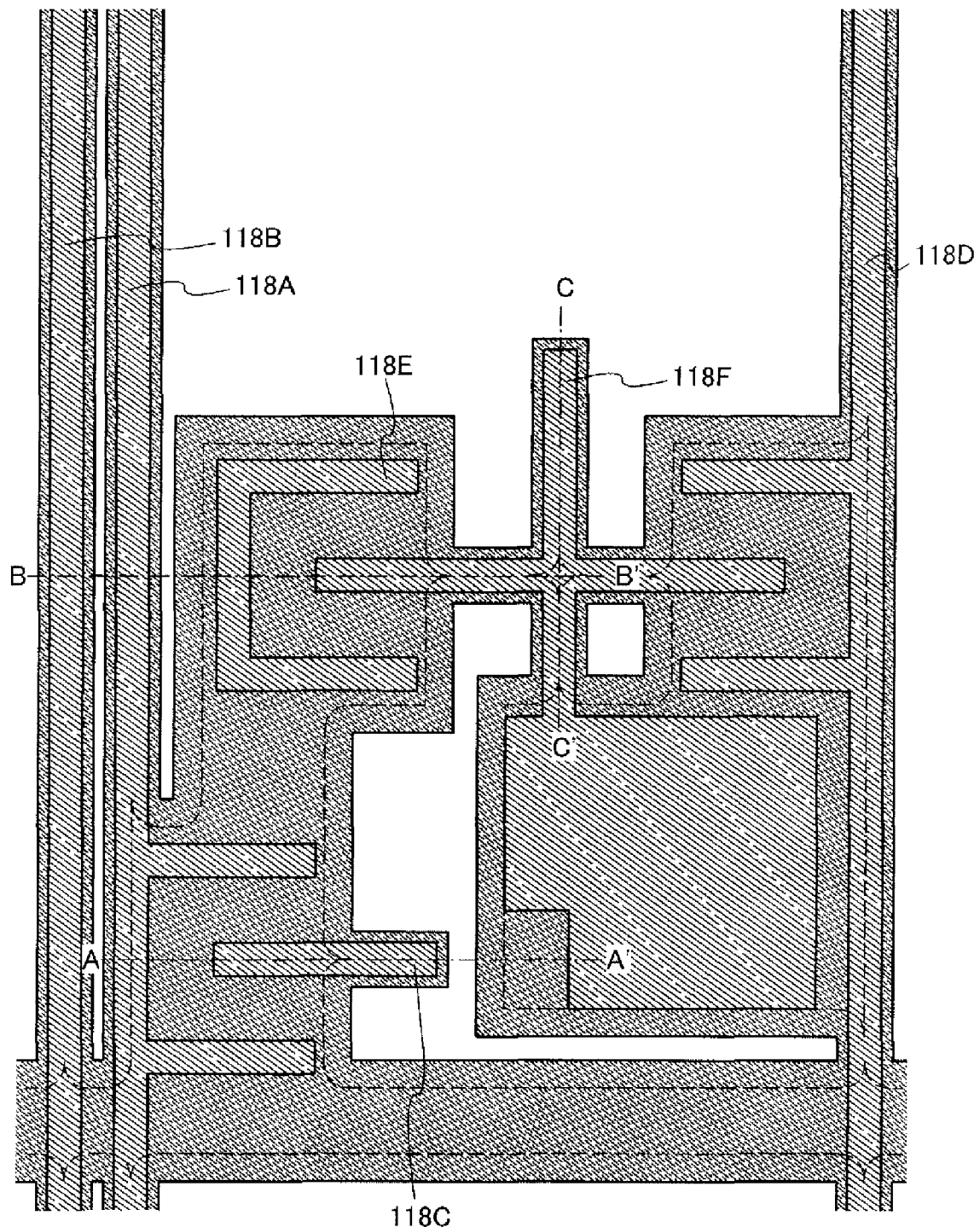
FIG. 4 illustrates an example of a method for manufacturing a thin film transistor and a display device.
Figure 5:
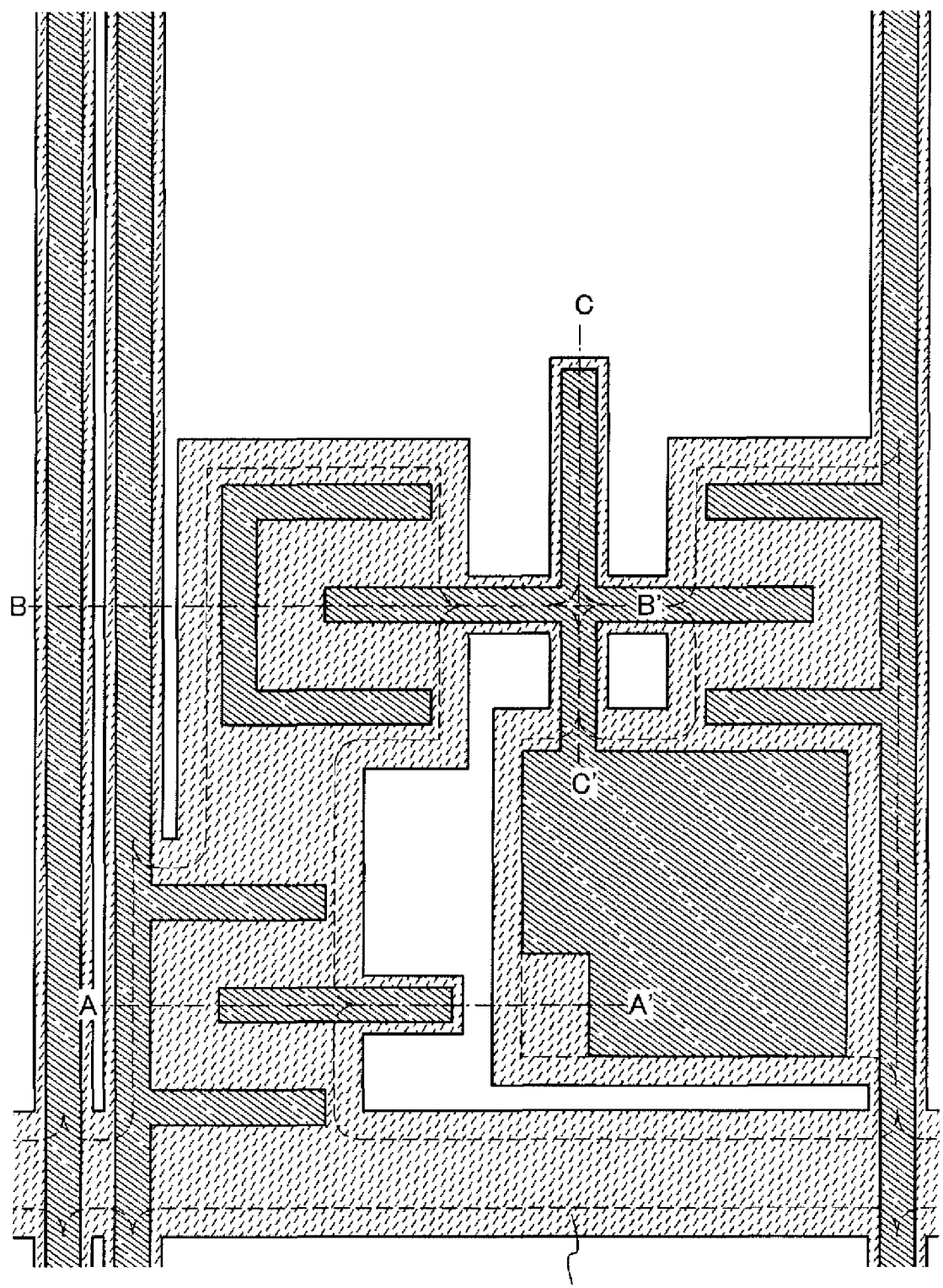
FIG. 5 illustrates an example of a method for manufacturing a thin film transistor and a display device.

The gate electrode layer 116C illustrated in FIG. 3 serves as a support which supports the thin-film stack body 114. By provision of the support, a film peeling of a gate insulating film and the like formed over the gate electrode layer can be prevented. In addition, by provision of the support, a cavity region formed adjacent to the gate electrode layer 116 by the second etching can be prevented form being larger than necessary. Furthermore, by provision of the support, the thin-film stack body 114 can be prevented from being broken or damaged due to its own weight and, accordingly, yield is increased, which is preferable. However, the structure is not limited to the mode with the support, and the support is not necessarily provided.

As described above, the second etching is preferably performed by wet etching.

In the case where the second etching is performed by wet etching, aluminum or molybdenum may be deposited as the first conductive film 102, titanium or tungsten may be deposited as the second conductive film 110, and a chemical containing nitric acid, acetic acid, and phosphoric acid may be used for etching. Alternatively, molybdenum may be deposited as the first conductive film 102, titanium, aluminum, or tungsten may be deposited as the second conductive film 110, and a chemical containing hydrogen peroxide water may be used for etching.

In the case where the second etching is performed by wet etching, it is most preferable that a layered film in which molybdenum is deposited over aluminum to which neodymium is added be formed as the first conductive film 102, tungsten be deposited as the second conductive film 110, and a chemical containing nitric acid at 2%, acetic acid at 10%, and phosphoric acid at 72% be used for etching. By usage of a chemical having such a composition ratio, the first conductive film 102 can be etched without the second conductive film 110 being etched. Note that neodymium is added to the first conductive film 102 for the purpose of reducing resistance of aluminum and preventing hillocks.

The gate electrode layer 116 is formed to have a horn when seen from the above (see FIG. 3). This is because since the second etching for forming the gate electrode layer 116 is almost isotropic etching, etching is performed so that the distance d, between the side surface of the gate electrode layer 116 and the side surface of the thin-film stack body 114 can be almost uniform.

Next, the first resist mask 112 is reduced in size to partly expose the second conductive film 110, so that a second resist mask 118 is formed. As a means for forming the second resist mask 118 by reducing the first resist mask 112 in size, for example, ashing using oxygen plasma can be given. However, a means for forming the second resist mask 118 by reducing the first resist mask 112 in size is not limited to the above. A region where the second resist mask 118 is formed is roughly aligned with the region of the projected portion of the first resist mask 112. Note that the case of forming the second resist mask 118 after the second etching is described here; but is not limited thereto, and the second etching may be performed after the second resist mask 118 is formed.

In the case where the multi-tone mask is not used for formation of the first resist mask 112, the second resist mask 118 may be separately formed using a different photomask from that of the first resist mask 112.

Next, the second conductive film 110 in the thin-film stack body 114 is etched with use of the second resist mask 118, so that the source and drain electrode layer 120 is formed (see FIG. 4, FIG. 8A, FIG. 11A, and FIG. 14A). Here, as the etching conditions, the conditions by which films other than the second conductive film 110 are not unintentionally etched or eroded or are not easily unintentionally etched or eroded are selected. In particular, it is important that etching is performed on the conditions that the gate electrode layer 116 is not unintentionally etched or eroded or is not easily unintentionally etched or eroded.

The source and drain electrode layer 120 forms a source or drain electrode of the thin film transistor, the source wiring, the power supply wiring, the other electrode of the capacitor, and an electrode connecting the thin film transistor and one of electrodes of the light-emitting element. When the source and drain electrode layer 120 is referred to as a source and drain electrode layer 120A, it indicates an electrode layer for forming the source wiring 18 and one of the source and drain electrodes of the first transistor 11. When the source and drain electrode layer 120 is referred to as a source and drain electrode layer 120B, it indicates an electrode layer for forming the first power supply line 17. When the source and drain electrode layer 120 is referred to as a source and drain electrode layer 120C, it indicates an electrode layer for forming the other of the source and drain electrodes of the first film transistor 11 and an electrode connecting the first transistor 11 and a pixel electrode. When the source and drain electrode layer 120 is referred to as a source and drain electrode layer 120D, it indicates an electrode layer for forming the second power supply line 19 and one of the source and drain electrodes of the second transistor 12. When the source and drain electrode layer 120 is referred to as a source and drain electrode layer 120E, it indicates an electrode layer for forming one of the source and drain electrodes of the third transistor 13. When the source and drain electrode layer 120 is referred to as a source and drain electrode layer 120F, it indicates an electrode layer for forming the other electrode of the capacitor 14, the other of the source and drain electrodes of the second transistor 12, the other of the source and drain electrodes of the third transistor 13, and an electrode connecting the above electrodes and one of electrodes of the light-emitting element.

Second resist masks 118A, 118B, 118C, 118D, 118E, and 118F indicate resist masks overlapping with the source and drain electrode layer 120A, the source and drain electrode layer 120B, the source and drain electrode layer 120C, the source and drain electrode layer 120D, the source and drain electrode layer 120E, and the source and drain electrode layer 120F, respectively.

Note that for etching the second conductive film 110 in the thin-film stack body 114, either wet etching or dry etching may be performed.

Then, the impurity semiconductor film 108 and an upper portion of the semiconductor film 106 (back channel portion) in the thin-film stack body 114 are etched to form a source and drain region 122 and a semiconductor layer 124 (see FIG. 5, FIG. 8B, FIG. 11B, and FIG. 14B). Here, as the etching conditions, the conditions by which films other than the impurity semiconductor film 108 and the semiconductor film 106 are not unintentionally etched or eroded or are not easily unintentionally etched or eroded are selected. In particular, it is important that etching is performed on the conditions that the gate electrode layer 116 is not unintentionally etched or eroded or is not easily unintentionally etched or eroded.

Note that the etching of the impurity semiconductor film 108 and the upper portion of the semiconductor film 106 (back channel portion) in the thin-film stack body 114 can be performed by dry etching or wet etching.

Then, the second resist mask 118 is removed, and a thin film transistor is completed (see FIG. 6, FIG. 8C, FIG. 11C, and FIG. 14C). As described above, the thin film transistor can be manufactured using one photomask (multi-tone mask).

Figure 8A:
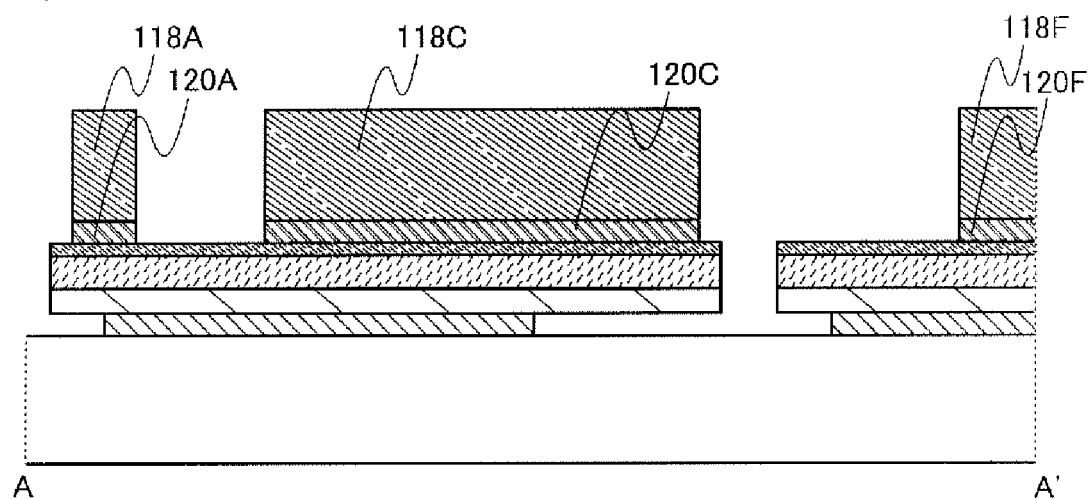
FIGS. 8A to 8C illustrate an example of a method for manufacturing a thin film transistor and a display device.
Figure 8B:
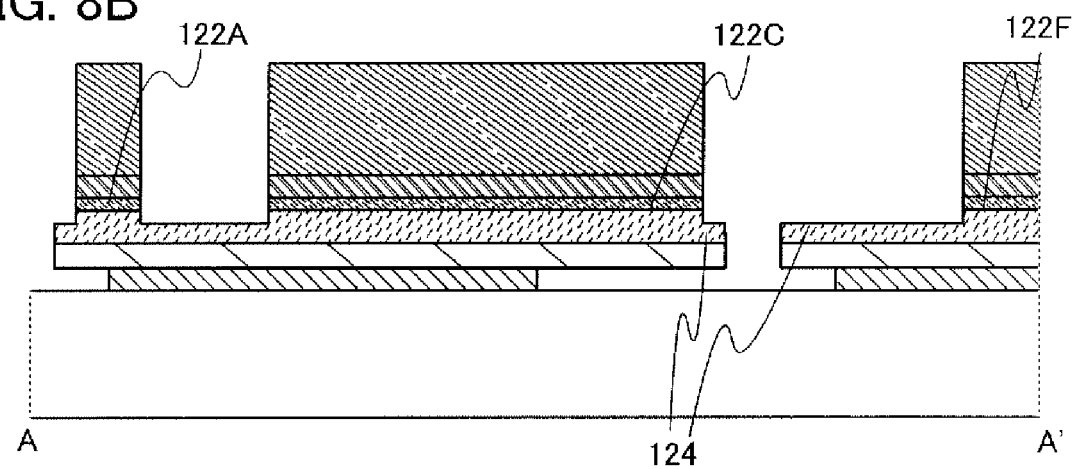
Figure 8C:
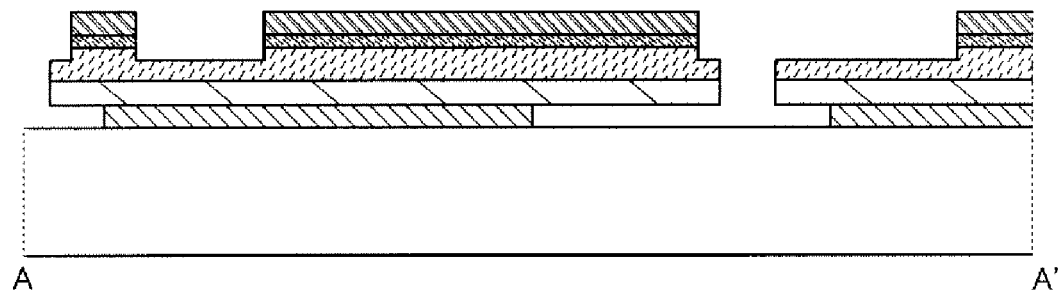

The steps described with reference to FIGS. 8A and 8B are collectively referred to as "third etching". The third etching may be performed in separate steps into plurality as described above or may be performed in a single step.

A second insulating film is formed to cover the thin film transistor which is formed in the above-described manner. Although the second insulating film may be formed of only a first protective film 126, the second insulating film here is formed of the first protective film 126 and a second protective film 128 (see FIG. 9A, FIG. 12A, and FIG. 15A). The first protective film 126 may be formed in a manner similar to the first insulating film 104. Preferably, the first protective film 126 is formed using silicon nitride containing hydrogen or silicon oxynitride containing hydrogen, so that the semiconductor layer is prevented from being contaminated by entering and diffusing an impurity such as metal into the semiconductor layer.

The second protective film 128 is formed by a method by which the surface thereof becomes almost planar. This is because when the surface of the second protective film 128 is almost planar, disconnection or the like of a first pixel electrode layer 132 formed over the second protective film 128 can be prevented. Accordingly, the phrase "almost planar" means planar in such an extent that the aforementioned aim can be achieved, and does not mean that high planarity is required.

The second protective film 128 can be formed, for example, by a spin coat method or the like using photosensitive polyimide, acrylic, epoxy resin, or the like. Note that the second protective film 128 is not limited to these materials and the formation method.

Note that the second conductive film 128 preferably has a layered structure of the above-described protective film which is formed to have an almost planar surface and a protective film, which covers the above-described protective film, for preventing entry and release of moisture. Specifically, the protective film for preventing entry and release of moisture is preferably formed using silicon nitride, silicon oxynitride, aluminum oxynitride, aluminum nitride, or the like. It is preferable to use a sputtering method for the formation method.

Figure 9A:
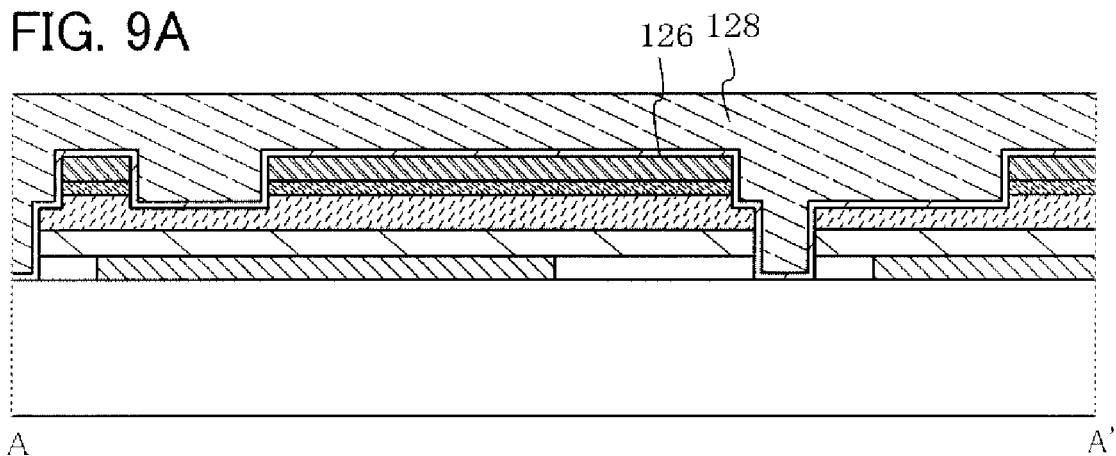
FIGS. 9A to 9C illustrate an example of a method for manufacturing a thin film transistor and a display device.
Figure 9B:
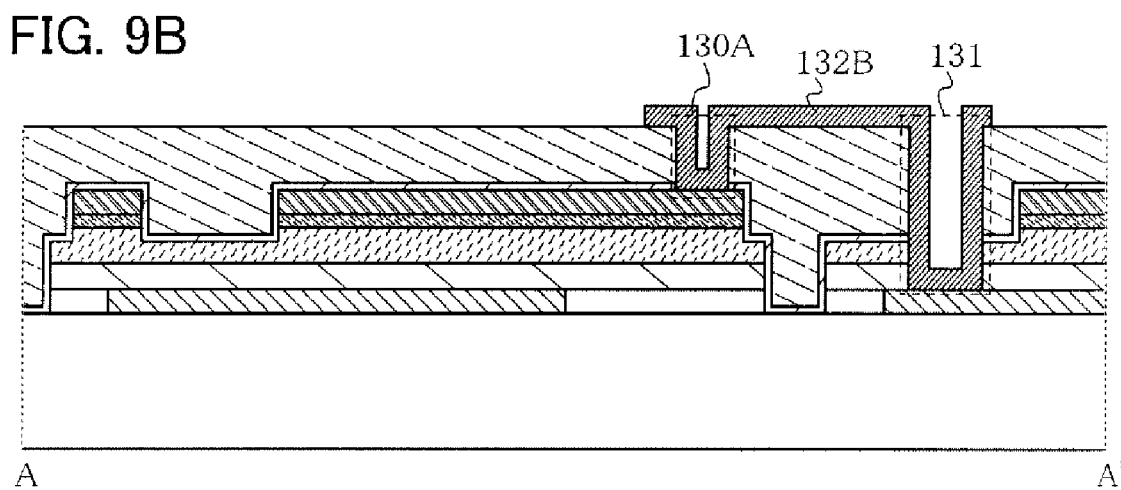
Figure 12A:
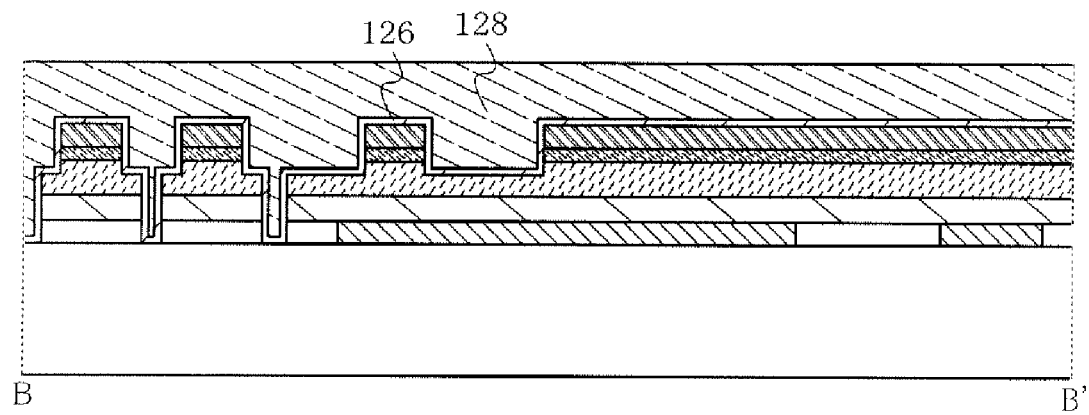
FIGS. 12A to 12C illustrate an example of a method for manufacturing a thin film transistor and a display device.
Figure 12B:
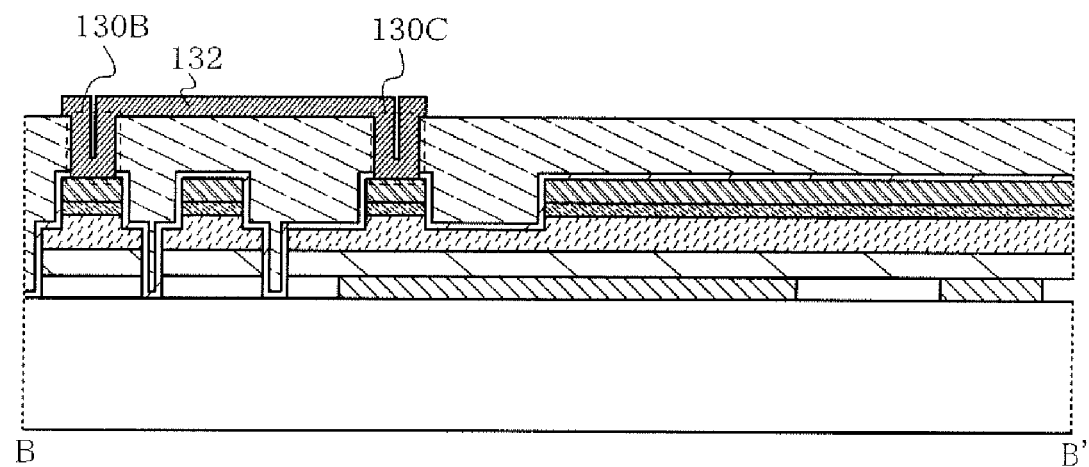
Figure 15A:
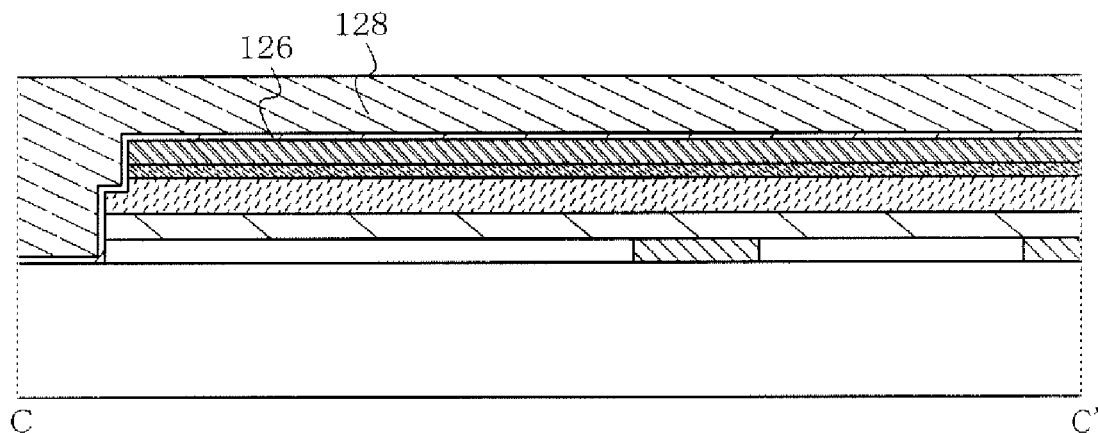
FIGS. 15A to 15C illustrate an example of a method for manufacturing a thin film transistor and a display device.
Figure 15B:
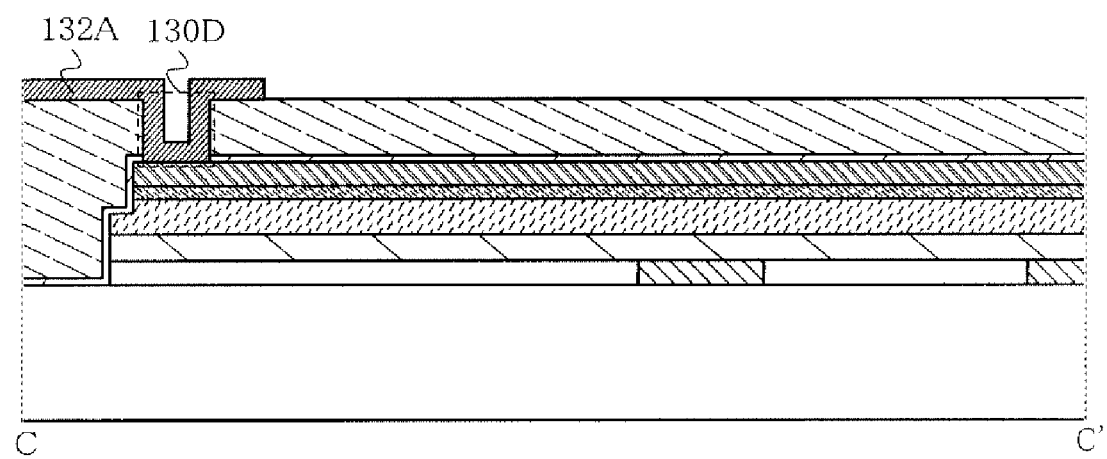

Next, a first opening 130 and a second opening 131 are formed in the second insulating film 128 (see FIG. 9B, FIG. 12B, and FIG. 15B). The first opening 130 is formed so as to reach at least a surface of the source and drain electrode layer. The second opening 131 is formed so as to reach at least the surface of the gate electrode layer. The formation method of the first opening 130 and the second opening 131 is not limited to a particular method, and may be determined as appropriate by a practitioner in accordance with the diameter of the first opening 130 or the like. For example, the first opening 130 and the second opening 131 can be formed by dry etching using photolithography.

The first opening 130 is provided so as to reach the source and drain electrode layer 120, and as illustrated in FIG. 6, a plurality of openings as the first opening 130 are provided for places where an opening is needed. A first opening 130A is provided at a portion over the source and drain electrode layer 120C, a first opening 130B is provided at a portion over the source and drain electrode layer 120B, and a first opening 130C is provided at a portion over the source and drain electrode layer 120E.

The second opening 131 is provided so as to reach the gate electrode layer 116. In other words, the second opening 131 is provided by removing not only the second insulating film but also the first insulating film 104 and the semiconductor layer 124 at a desired portion.

Formation of the openings by photolithography needs one photomask.

Next, the first pixel electrode layer 132 is formed over the second insulating film (see FIG. 6, FIG. 9B, FIG. 12B, and FIG. 15B). The first pixel electrode layer 132 is formed so as to be connected to the source and drain electrode layer 120 or the gate electrode layer 116 through the first opening 130 or the second opening 131. Specifically, the first pixel electrode layer 132 is formed so as to be connected to the source and drain electrode layer 120C through the first opening 130A, connected to the source and drain electrode layer 120B through the first opening 130B, connected to the source and drain electrode layer 120E through the first opening 130C, and connected to the gate electrode layer 116B through the second opening 131. In addition, the first pixel electrode layer 132 may have a single layer or a layered film including a plurality of films.

Formation of the first pixel electrode layer 132 by photolithography needs one photomask.

Since the thin film transistor included in the pixel is an n-channel transistor, it is preferable that the first pixel electrode layer 132 be formed using a material to be a cathode. As the material to be a cathode, a material with low work function such as Ca, Al, MgAg, or AlLi can be given.

Next, a partition 133 is formed on a side surface (end portion) of the first pixel electrode layer 132 and over the second insulating film. The partition 133 has an opening, and at the opening, the first pixel electrode layer 132 is exposed. The partition 133 is formed using an organic resin film, an inorganic insulating film, or organic polysiloxane. Specifically, the partition 133 is preferably formed using polyimide, polyamide, polyimide amide, acrylic, or benzocyclobutene. It is particularly preferable that the partition 133 be formed using a photosensitive material to have an opening over the first pixel electrode layer 132 so that a sidewall of the opening can be formed as a tilted surface with continuous curvature.

Next, an EL layer 134 is formed so as to be in contact with the first pixel electrode layer 132 in the opening of the partition 133. The EL layer 134 may be formed to have a single layer or a layered film including a plurality of films. The EL layer 134 includes at least a light-emitting layer. It is preferable that the light emitting layer is connected to the second pixel electrode layer 135 through an electron injection layer.

Then, the second pixel electrode layer 135 formed using a material to be an anode is formed so as to cover the EL layer 134. The second pixel electrode layer 135 corresponds to the common electrode 20 in FIG. 1. The second pixel electrode layer 135 can be formed using a light-transmitting conductive material. Here, as the light-transmitting conductive material, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like may be given. The film of a light-transmitting conductive material may be formed by a sputtering method, a CVD method, or the like; however, the formation method thereof is not limited to a particular method. In addition, the second pixel electrode layer 135 may have a single layer or a layered film including a plurality of films.

Here, ITO is used for the second pixel electrode layer 135. In the opening of the partition 133, the first pixel electrode layer 132, the EL layer 134, and the second pixel electrode layer 135 overlap with each other, whereby a light-emitting element 136 is formed. The light-emitting element 136 corresponds to the light-emitting element 15 in FIG. 1. After that, it is preferable that a third protective film 137 be formed over the second pixel electrode layer 135 and the partition 133 so as to prevent oxygen, hydrogen, moisture, carbon oxide, or the like from entering the light-emitting element 136 (not illustrated). As for the third protective film 137, a material having a function of preventing entry or release of moisture is selected, which is similar to that of the second protective film 128. The third protective film 137 is preferably formed using silicon nitride, silicon oxynitride, aluminum oxynitride, aluminum nitride, or the like. Furthermore, it is preferable to form a silicon nitride film, a DLC film, or the like to cover the third protective film.

Then, it is preferable that packaging (sealing) be performed with a protective film (e.g., a bonding film or an ultraviolet curable resin film) or a cover material in order to prevent exposure to air. The protective film or the cover material is preferably formed from a material having high airtightness and little degasification.

Figure 9C:
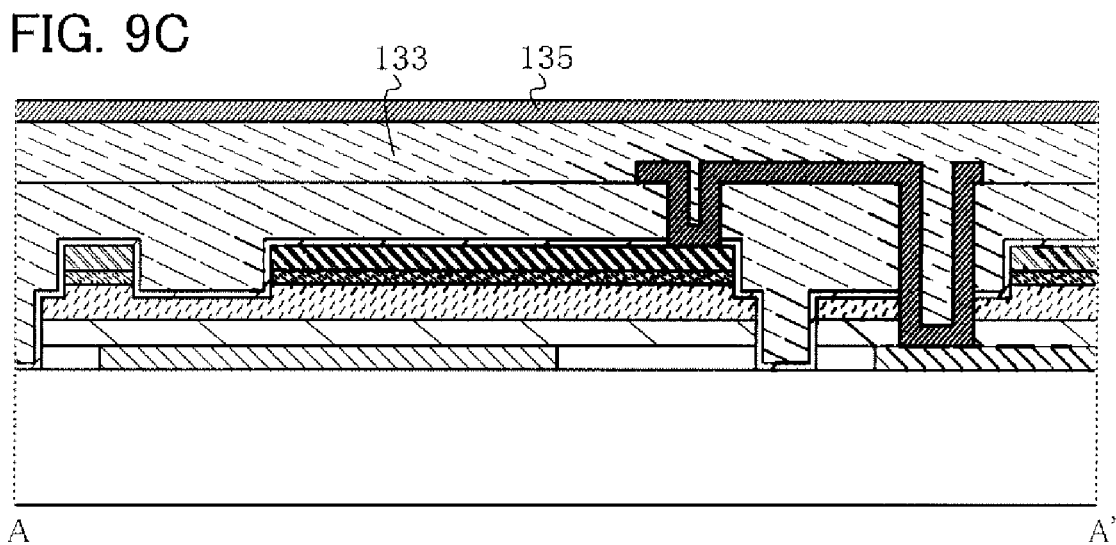
Figure 12C:
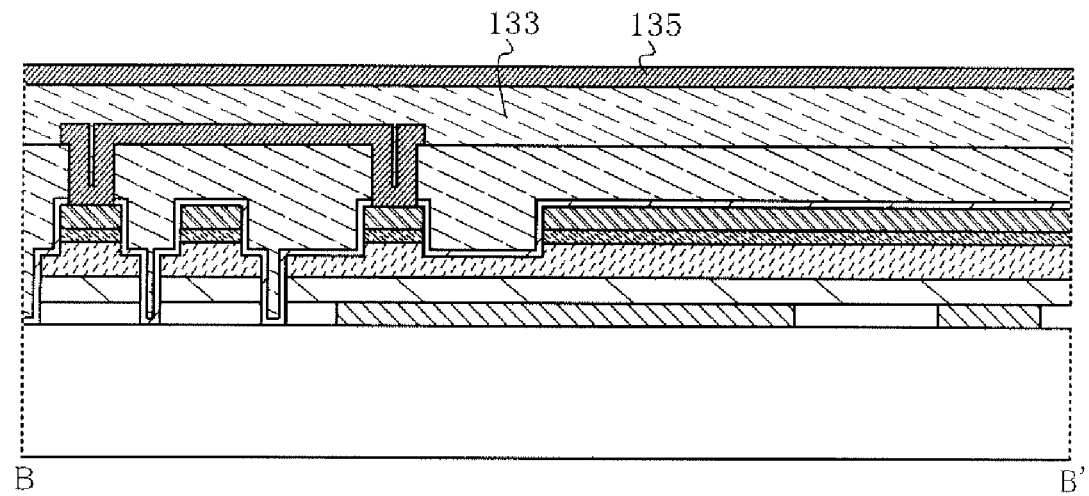
Figure 15C:
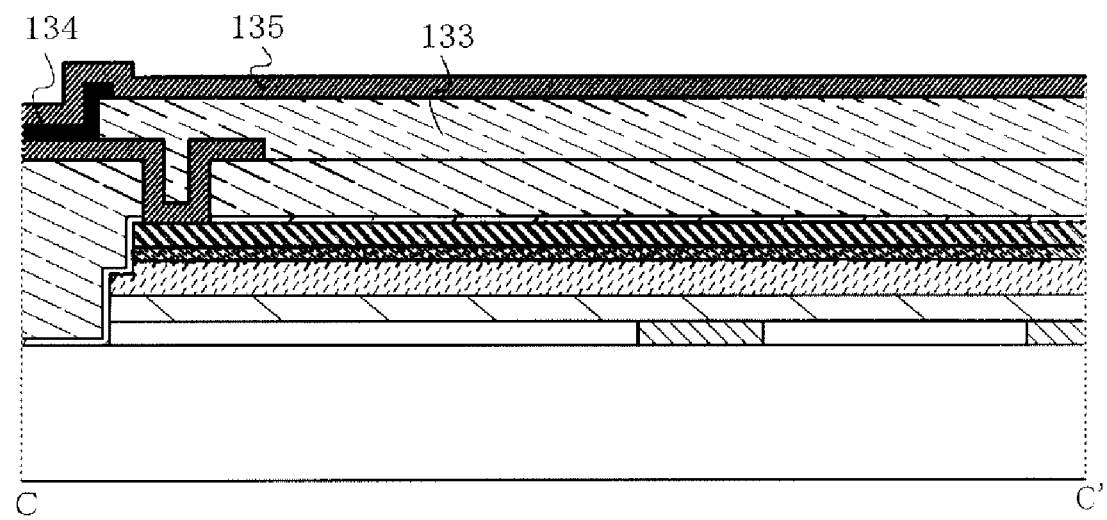

As described above, formation of a top-emission type EL display device can be conducted up to the light-emitting element therein (see FIG. 9C, FIG. 12C, and FIG. 15C). However, an EL display device of an embodiment of the invention to be disclosed is not limited to the above described. A bottom-emission type EL display device or a dual-emission type EL display device can also be employed. In the bottom-emission structure and the dual-emission structure, a light-transmitting conductive material may be used for the first pixel electrode layer 132. In the case where the first pixel electrode layer is formed using a material for an anode, the first pixel electrode is formed using, for example, ITO. When the first pixel electrode layer 132 has such a structure, high efficiency of light extraction can be accomplished, and a bottom-emission type EL display device can be manufactured. Then, the second pixel electrode 135 is formed using a material for a cathode so as to cover the EL layer 134. The second pixel electrode 135 corresponds to the common electrode 20 in FIG. 1. A material having low work function such as Ca, Al, MgAg, or AlLi is given as the material for the cathode. It is preferable that the EL layer 134 and the second pixel electrode 135 be formed by an evaporation method through a mask. Therefore, the second pixel electrode layer 135 is preferably formed using a material that can be evaporated. Note that when a pixel is constructed by a circuit illustrated in FIG. 1, it is preferable that the first pixel electrode layer 132 be an anode and the second pixel electrode layer 135 be a cathode.

A material and a formation method of the protective film and the like described above are not limited to the aforementioned material and method. Any film is acceptable as long as it does not prevent light emission from the EL layer and can prevent deterioration and the like.

Alternatively, in the top-emission structure, a first pixel electrode layer 132A may be formed so as to include a region where a pixel circuit is formed. In this case, first, only a conductive layer corresponding to a first pixel electrode layer 132B and a first pixel electrode layer 132C is formed, an insulating film having a first opening 130D is formed over the conductive layer, and then the first pixel electrode layer 132A may be formed so as to be connected to the source and drain electrode layer 120F through the opening 130D. The first pixel electrode layer 132A is formed so as to include a region where a pixel circuit is formed, whereby a light-emitting region can be extended and thus high definition display can be achieved.

Although an organic EL element is described here as a light-emitting element, an inorganic EL element can also be used as a light-emitting element.

Here, a terminal connection portion of the active matrix substrate manufactured by the above-described steps will be described with reference to FIG. 17, FIG. 18, and FIGS. 19A to 19C.

Figure 17:
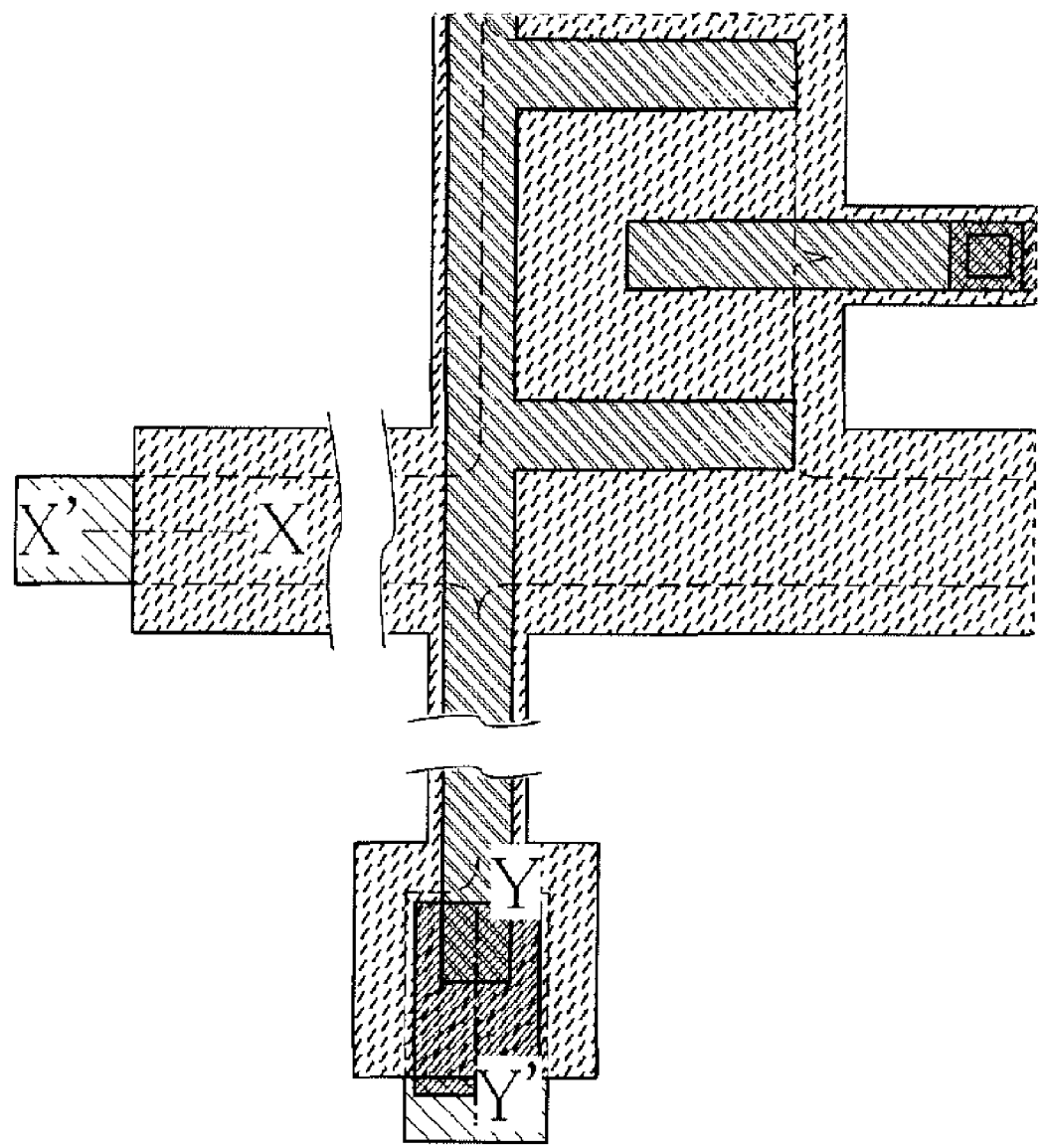
FIG. 17 illustrates a connection portion of an active matrix substrate.

FIG. 17 is a top view and FIG. 18 and FIGS. 19A to 19C are cross-sectional views of a terminal connection portion on the gate wiring side and a terminal connection portion on the source wiring side of the active matrix substrate manufactured by the above-described steps.

FIG. 17 is a top view of the gate wiring and the source wiring extended from the pixel portion, in the terminal connection portion on the gate wiring side and the terminal connection portion on the source wiring side. The first power supply line 17 and the second power supply line 19 may be similar to the source wiring 18. Here, the partition 133 and the second pixel electrode 135 are not illustrated in FIG. 17.

Figure 18:
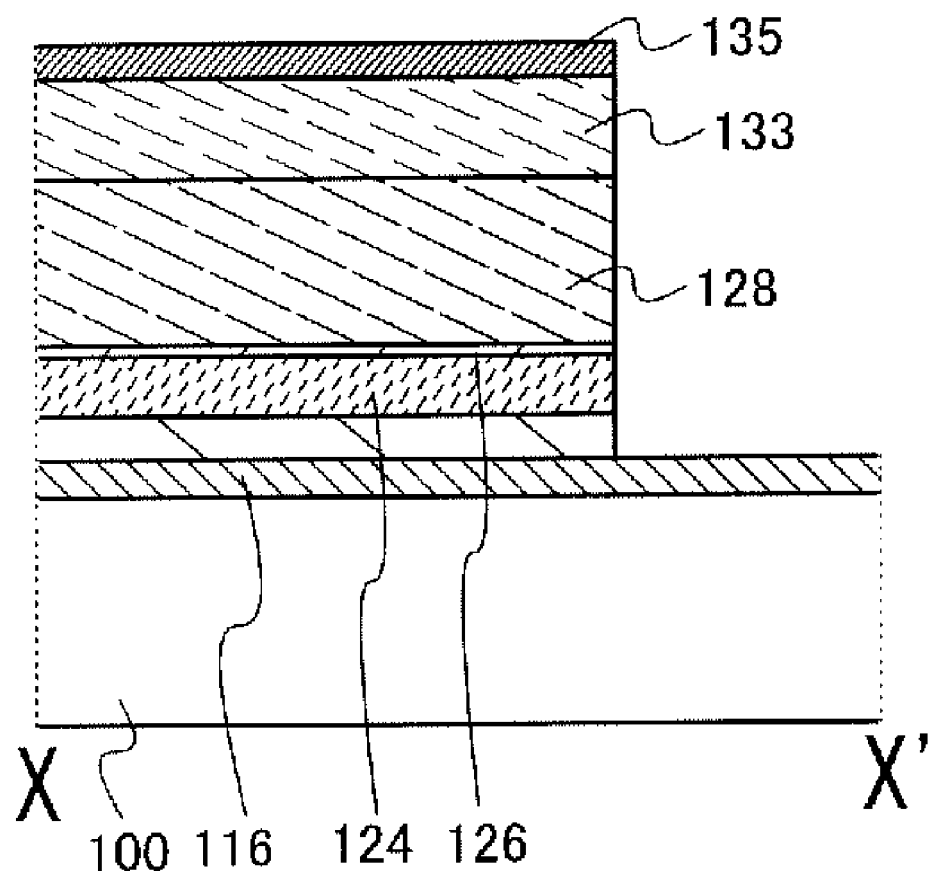
FIG. 18 illustrates a connection portion of an active matrix substrate.

FIG. 18 is a cross-sectional view taken along a line X-X' in FIG. 17. That is, FIG. 18 is a cross-sectional view of the terminal connection portion on the gate wiring side. In FIG. 18, only the gate electrode layer 116 is exposed. A terminal portion is connected to the region where the gate electrode layer 116 is exposed.

Figure 19A:
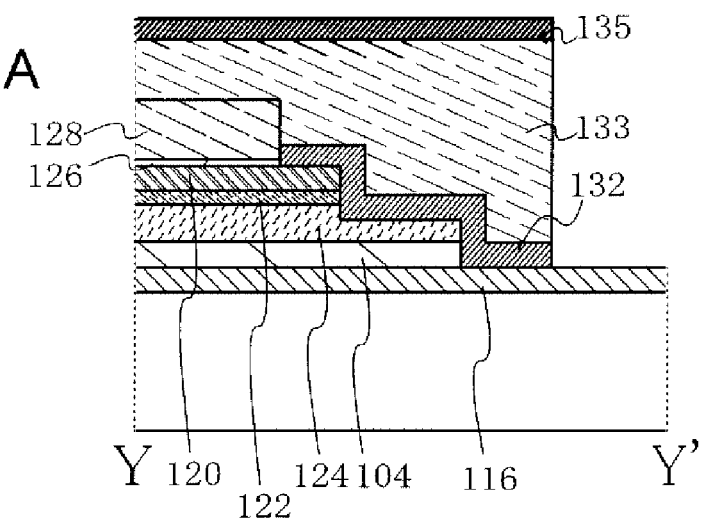
FIGS. 19A to 19C each illustrate a connection portion of an active matrix substrate.
Figure 19B:
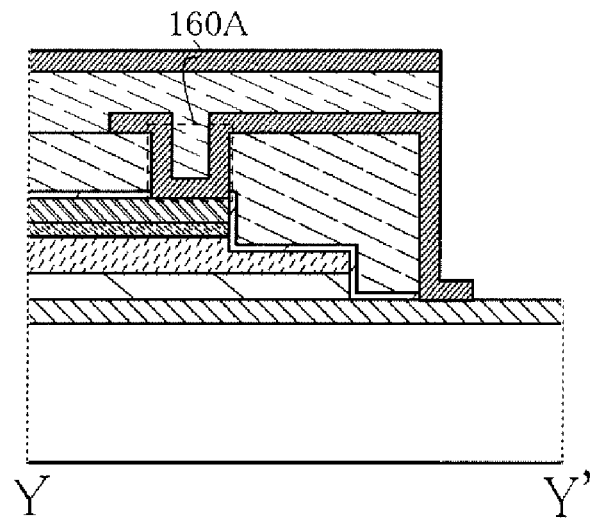
Figure 19C:
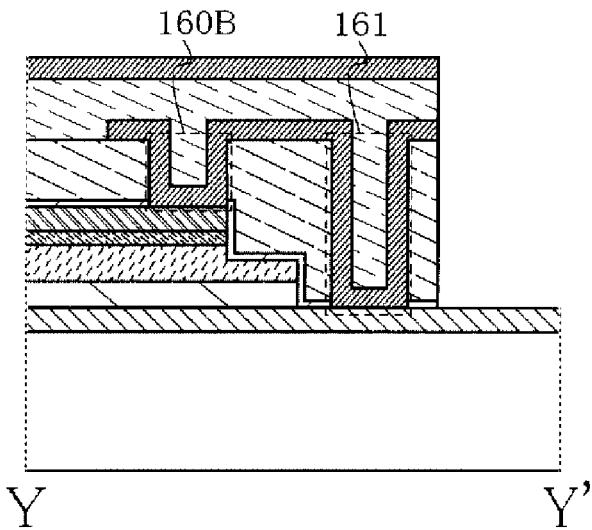

FIGS. 19A to 19C are cross-sectional views taken along a line Y-Y' in FIG. 17. That is, FIGS. 19A to 19C are cross-sectional views illustrating an example of the terminal connection portion on the source wiring side. In the cross section along the line Y-Y' illustrated in FIGS. 19A to 19C, the gate electrode layer 116 and the source and drain electrode layer 120 are connected to each other via the pixel electrode layer 132 (the same layer as at least the first pixel electrode layer 132B or the first pixel electrode layer 132C). FIGS. 19A to 19C illustrate various connection states between the gate electrode layer 116 and the source and drain electrode layer 120. Here, any of these forms or forms other than those illustrated in FIGS. 19A to 19C may be used for the terminal connection portion of an EL display device. With the structure in which the source and drain electrode layer 120 is connected to the gate electrode layer 116, the height of the terminal connection portion can be made almost uniform.

Note that the number of openings is not limited to those in FIGS. 19A to 19C. Not only one opening but also a plurality of openings may be provided for one terminal. In the case where a plurality of openings are provided for one terminal, even when any of the openings is not formed favorably due to insufficient etching for forming the opening, electric connection can be realized at the other opening. Further, even in the case where all the openings are formed without any problems, the contact area can be made larger and contact resistance can be reduced, which is preferable.

In FIG. 19A, electric connection is realized in such a manner that end portions of the first protective film 126 and the second protective film 128 are removed by etching or the like to expose the gate electrode layer 116 and the source and drain electrode layer 120, and the first pixel electrode layer 132 (the same layer as at least the first pixel electrode layer 132B or the first pixel electrode layer 132C) is formed over the exposed region. The top view illustrated in FIG. 17 corresponds to the top view of FIG. 19A.

The formation of the region where the gate electrode layer 116 and the source and drain electrode layer 120 are exposed can be performed at the same time as the formation of the first opening 130 and the second opening 131.

In FIG. 19B, electric connection is realized in such a manner that a third opening 160A is provided in the first protective film 126 and the second protective film 128, end portions of the first protective film 126 and the second protective film 128 are removed by etching or the like to expose the gate electrode layer 116 and the source and drain electrode layer 120, and the first pixel electrode layer 132 (the same layer as at least the first pixel electrode layer 132B or the first pixel electrode layer 132C) is formed over the exposed region.

The formation of the third opening 160A and the formation of the region where the gate electrode layer 116 is exposed can be performed at the same time as the formation of the first opening 130 and the second opening 131.

In FIG. 19C, electric connection is realized in such a manner that a third opening 160B and a fourth opening 161 are provided in the first protective film 126 and the second protective film 128 to expose the gate electrode layer 116 and the source and drain electrode layer 120, and the first pixel electrode layer 132 (the same layer as at least the first pixel electrode layer 132B or the first pixel electrode layer 132C) is formed over the exposed region. Here, end portions of the first protective film 126 and the second protective film 128 are removed by etching or the like similarly to those of FIGS. 19A and 19B, and this etched region is used as a terminal connection portion.

The formation of the third opening 160B and the fourth opening 161 and the formation of the region where the gate electrode layer 116 is exposed can be performed at the same time as the formation of the first opening 130 and the second opening 131.

Note that the third opening 160 is provided so as to reach the source and drain electrode layer 120, which is similar to the first opening 130, and the fourth opening 161 is provided so as to reach the gate electrode layer 116, which is similar to the second opening 131. Although the partition 133 and the second pixel electrode layer 135 are illustrated in FIG. 18 and FIG. 19, they need not to be provided at the terminal connection portion.

A flexible printed circuit (FPC) is connected to an input terminal (in FIGS. 19A to 19C, the region where the gate electrode layer 116 is exposed) of the terminal portion. The FPC has a wiring formed of a conductive film over an organic resin film of polyimide or the like, and is connected to the input terminal through an anisotropic conductive paste (hereinafter referred to as an ACP). The general ACP includes a paste functioning as an adhesive and particles plated with gold or the like to have a conductive surface, which have a diameter of several tens of micrometers to several hundreds of micrometers. When the particles mixed in the paste have contact with the conductive layer over the input terminal and the conductive layer over the terminal connected to the wiring formed in the FPC, electric connection therebetween can be achieved.

In accordance with described above, an EL display device can be manufactured.

As described above, the number of photomasks which are used is reduced, and the number of manufacturing steps of a thin film transistor and an EL display device can be significantly reduced.

Further, the number of manufacturing steps of a thin film transistor can be significantly reduced without a complicated step such as backside light exposure, resist reflow, a lift-off method, or the like. Therefore, the number of manufacturing steps of an EL display device can be significantly reduced without a complicated step.

Moreover, the number of manufacturing steps of a thin film transistor can be significantly reduced while keeping electric characteristics of the thin film transistor.

Furthermore, in accordance with the aforementioned effects, manufacturing cost of the EL display device can be significantly reduced.

Embodiment 2

In this embodiment, electronic appliances in which a display panel or a display device manufactured by a method described in Embodiment 1 is incorporated as a display portion will be described with reference to FIGS. 20A and 20B, FIG. 21, and FIGS. 22A to 22C. As such electronic appliances, for example, cameras such as video cameras and digital cameras, displays that can be mounted on a person's head (goggle-type displays), car navigation systems, projectors, car stereos, personal computers, and portable information terminals (e.g., mobile computers, mobile phones, and electronic books) can be given. Examples thereof are illustrated in FIGS. 20A and 20B.

Figure 20A:
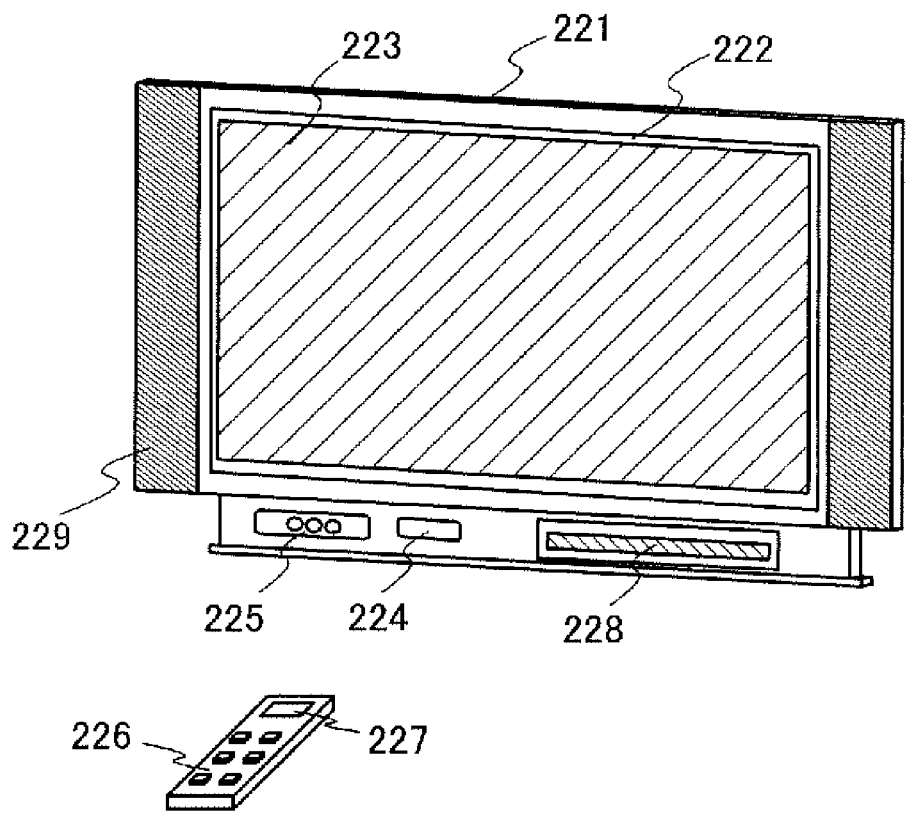
FIGS. 20A and 20B each illustrate an electronic device.
Figure 20B:
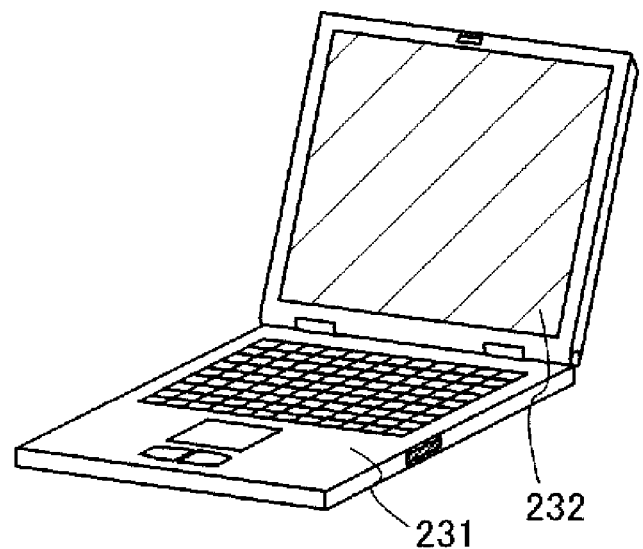

FIG. 20A illustrates a television device. The television device illustrated in FIG. 20A can be completed by incorporating an EL display panel in a chassis. A main screen 223 is formed using a display panel manufactured according to the method described in Embodiment 1. In addition, a speaker portion 229, operation switches, and the like are provided as accessory equipment.

As illustrated in FIG. 20A, a display panel 222 manufactured according to the method described in Embodiment 1 is incorporated into a chassis 221, and general TV broadcast can be received by a receiver 225. When the television device is connected to a communication network by wired or wireless connections via a modem 224, one-way (from a sender to a receiver) or two-way (between a sender and a receiver or between receivers) information communication can be performed. Operations of the television device can be carried out using switches that are incorporated into the chassis or by a remote control device 226 provided separately, and a display portion 227 that displays information to be output may be provided for the remote control device 226.

Further, the television device may include a sub-screen 228 formed using a second display panel for displaying channels, volume, and the like, in addition to the main screen 223.

Figure 21:
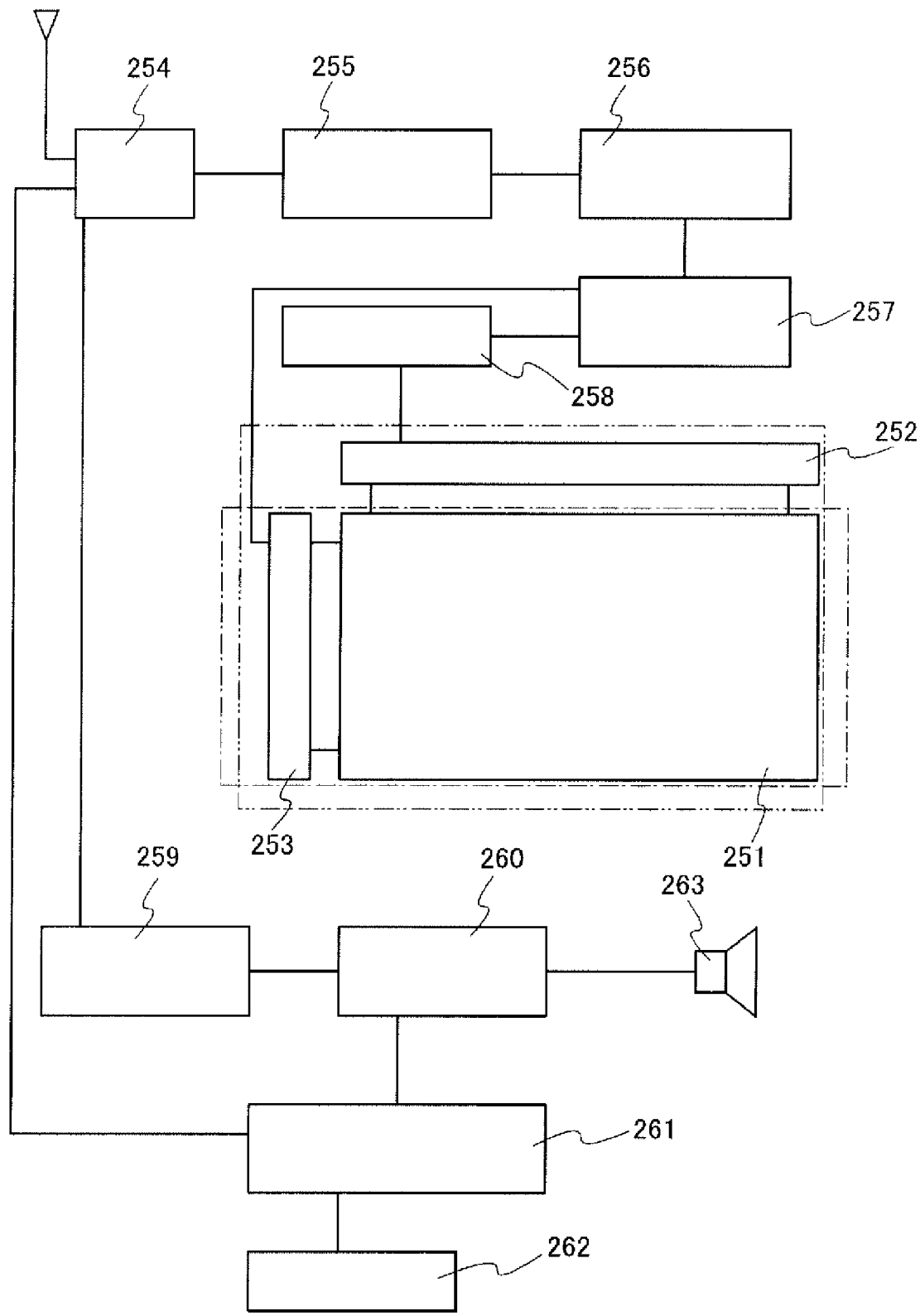
FIG. 21 illustrates an electronic device.

FIG. 21 illustrates a block diagram of a main structure of a television device. A display panel is provided with a pixel portion 251. A signal line driver circuit 252 and a scan line driver circuit 253 may be mounted on the display panel by a COG method.

As structures of other external circuits, a video signal amplifier circuit 255 amplifying a video signal among signals received by a tuner 254, a video signal processing circuit 256 converting signals output from the video signal amplifier circuit 255 into chrominance signals corresponding to respective colors of red, green, and blue, a control circuit 257 for converting the video signal into a signal which meets input specifications of a driver IC, and the like are provided on the input side of the video signal. The control circuit 257 outputs signals to each of the scanning line side and the signal line side. In the case of digital drive, a signal dividing circuit 258 may be provided on the signal line side and an input digital signal may be divided into m (m is an integer) pieces and supplied.

Among the signals received by the tuner 254, the audio signals are transmitted to an audio signal amplifier circuit 259, and an output thereof is supplied to a speaker 263 through an audio signal processing circuit 260. A controlling circuit 261 receives control information of a receiving station (reception frequency) or sound volume from an input portion 262, and transmits signals to the tuner 254 and the audio signal processing circuit 260.

An EL display device of an embodiment of the invention is, of course, not limited to the television device, and can be applied to a variety of applications such as monitors of personal computers, or display media that have a large area, such as information display boards in railway stations, airports, and the like, and street-side advertisement display boards. Therefore, by application of the method for manufacturing an EL display device of the invention, productivity of these display media can be improved.

The main screen 223 and the subscreen 228 are formed using the display panel or the display device manufactured according to the method for manufacturing a display device in Embodiment 1, whereby productivity of the television device can be improved.

A portable computer illustrated in FIG. 20B includes a main body 231, a display portion 232, and the like. The display panel or the display device manufactured according to the method for manufacturing a display device in Embodiment 1 is applied to the display portion 232, whereby productivity of the computer can be improved.

Figure 22A:
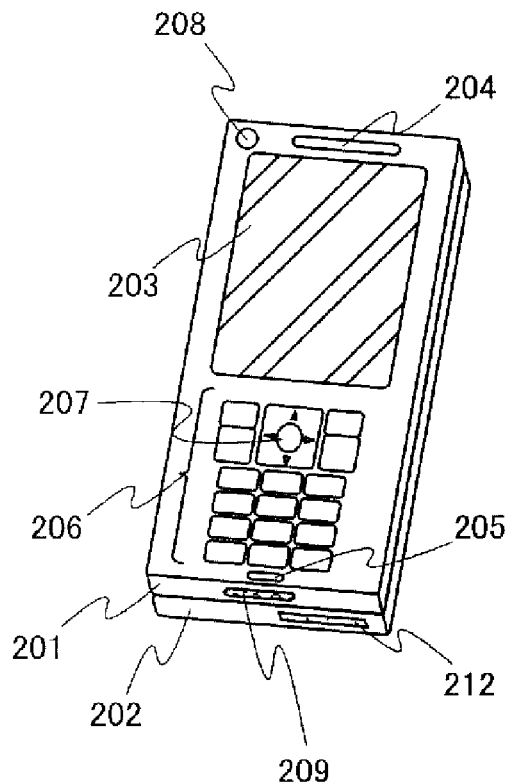
FIGS. 22A to 22C illustrate an electronic device.
Figure 22B:
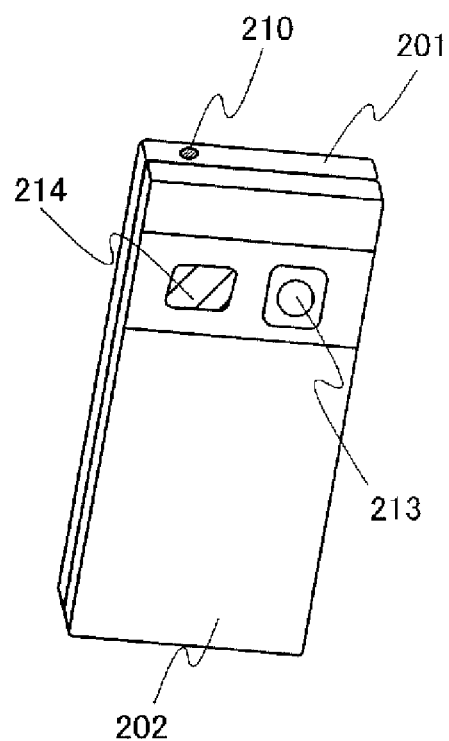
Figure 22C:
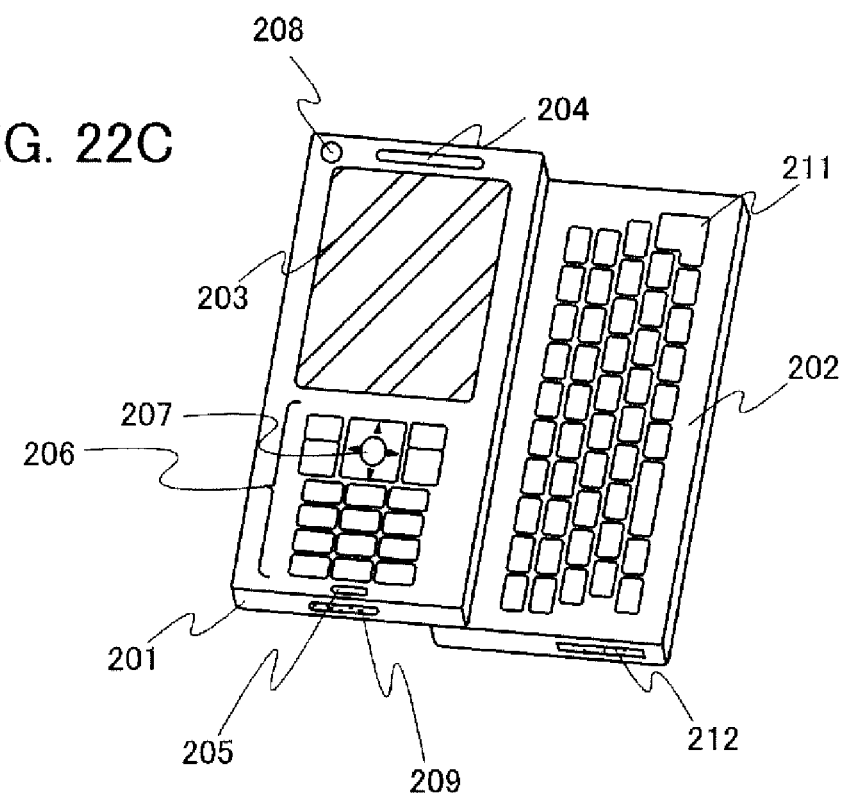

FIGS. 22A to 22C illustrate an example of a mobile phone. FIG. 22A is a front view, and FIG. 22B is a rear view, and FIG. 22C is a front view in which two chassis are slid. A mobile phone includes two chassis 201 and 202. The mobile phone 200 is a so-called smartphone which has both functions of a mobile phone and a portable information terminal, and incorporates a computer and can process a variety of data in addition to voice calls.

The mobile phone 200 has the chassis 201 and 202. The chassis 201 includes a display portion 203, a speaker 204, a microphone 205, operation keys 206, a pointing device 207, a front camera lens 208, a jack 209 for an external connection terminal, an earphone terminal 210, and the like, while the chassis 202 includes a keyboard 211, an external memory slot 212, a rear camera 213, a light 214, and the like. In addition, an antenna is incorporated in the chassis 201.

In addition to the above-described structure, a wireless IC chip, a small size memory device, or the like may be incorporated in the mobile phone 200.

The chassis 201 and 202 overlapping with each other (illustrated in FIG. 22A) slide and can be developed as illustrated in FIG. 22C. The display panel or display device manufactured according to the method for manufacturing a display device described in Embodiment 1 can be incorporated in the display portion 203. Since the display portion 203 and the front camera lens 208 are provided in the same plane, the mobile phone 200 can be used as a videophone. A still image and a moving image can be taken by using the rear camera 213 and the light 214 with use of the display portion 203 as a viewfinder.

With use of the speaker 204 and the microphone 205, the mobile phone 200 can be used as an audio recording device (recording device) or an audio reproducing device. With the use of the operation keys 206, further, operations of incoming and outgoing of calls, simple information input such as electronic mail, scrolling of a screen, cursor movement, e.g., for selecting information to be displayed in the display portion, and the like are possible.

If much information is needed to be treated in such cases where documents are produced, the mobile phone is used as a portable information terminal, and the like, the use of the keyboard 211 is convenient. By sliding the chassis 201 and 202 which overlap with each other (see FIG. 22A), the chassis 201 and 202 can be developed as illustrated in FIG. 22C. In using the mobile phone 200 as a portable information terminal, a cursor can be moved smoothly with use of the keyboard 211 and the pointing device 207. The jack 209 for an external connection terminal can be connected to an AC adapter or a variety of cables such as a USB cable, and charging and data communication with a personal computer or the like is possible. Further, by inserting a recording medium in the external memory slot 212, a larger amount of data can be stored and moved.

The rear face of the chassis 202 (see FIG. 22B) is provided with the rear camera 213 and the light 214, and a still image and a moving image can be taken with use of the display portion 203 as a viewfinder.

Further, the mobile phone may have an infrared communication function, a USB port, a function of receiving one segment television broadcast, a non-contact IC chip, an earphone jack, or the like, in addition to the above functions and structures.

The variety of electronic appliances described in this embodiment can be manufactured according to the method for manufacturing a thin film transistor and a display device in Embodiment 1; therefore, productivity of these electronic appliances can be improved.

Accordingly, manufacturing cost of these electronic appliances can be significantly reduced.

This application is based on Japanese Patent Application serial no. 2008-055024 filed with Japan Patent Office on Mar. 5, 2008, the entire contents of which are hereby incorporated by reference.

What is claimed is:

1. A method for manufacturing an EL display device comprising the steps of:
   forming a thin film transistor comprising the steps of:
      stacking a first conductive film, a first insulating film, a semiconductor film, an impurity semiconductor film, and a second conductive film sequentially;
      forming a first resist mask over the second conductive film;
      first etching the first insulating film, the semiconductor film, the impurity semiconductor film, and the second conductive film using the first resist mask to expose at least a surface of the first conductive film;
   second etching a portion of the first conductive film to form a gate electrode layer in such a manner that a width of the gate electrode layer is narrower than a width of the first insulating film;
      forming a second resist mask over the second conductive film; and
      third etching the second conductive film, the impurity semiconductor film, and a part of the semiconductor film using the second resist mask to form a source and drain electrode layer, a source and drain region layer, and a semiconductor layer;

removing the second resist mask;

forming a second insulating film to cover the thin film transistor;

forming an opening in the second insulating film so as to expose a part of the source and drain electrode layer;

forming a first pixel electrode selectively over the opening and the second insulating film;

forming an EL layer over the first pixel electrode; and forming a second pixel electrode over the EL layer.

2. The method for manufacturing an EL display device, according to claim 1, wherein the first resist mask is formed using a multi-tone mask.

3. The method for manufacturing an EL display device, according to claim 1, wherein the first etching is dry etching and the second etching is wet etching.

4. The method for manufacturing an EL display device, according to claim 1, wherein the second insulating film is formed by stacking an insulating film formed by a CVD method or a sputtering method and an insulating film formed by a spin coat method.

5. A method for manufacturing an EL display device comprising the steps of:
   forming a thin film transistor comprising the steps of:
   stacking a first conductive film, a first insulating film, a semiconductor film, an impurity semiconductor film, and a second conductive film sequentially;
   forming a first resist mask having a recessed portion over the second conductive film;
   first etching the first insulating film, the semiconductor film, the impurity semiconductor film, and the second conductive film with use of the first resist mask to expose at least a surface of the first conductive film;
   second etching a part of the first conductive film to form a gate electrode layer in such a manner that a width of the gate electrode layer is narrower than a width of the first insulating film;
   forming a second resist mask by reducing the first resist mask in size to expose the second conductive film which overlaps with the recessed portion of the first resist mask; and
   third etching the second conducive film, the impurity semiconductor film, and a part of the semiconductor film using the second resist mask to form a source and drain electrode layer, a source and drain region layer, and a semiconductor layer;

removing the second resist mask;

forming a second insulating film to cover the thin film transistor;

forming an opening in the second insulating film to expose a part of the source and drain electrode layer;

forming a first pixel electrode selectively over the opening and the second insulating film;

forming an EL layer over the first pixel electrode; and forming a second pixel electrode over the EL layer.

6. The method for manufacturing an EL display device, according to claim 5, wherein the first resist mask is formed using a multi-tone mask.

7. The method for manufacturing an EL display device, according to claim 5, wherein the first etching is dry etching and the second etching is wet etching.

8. The method for manufacturing an EL display device, according to claim 5, wherein the second insulating film is formed by stacking an insulating film formed by a CVD method or a sputtering method and an insulating film formed by a spin coat method.

9. An EL display device comprising:
   a thin film transistor;
   a first insulating film over the thin film transistor;
   a first pixel electrode electrically connected to the thin film transistor;
   an EL layer over the first pixel electrode; and
   a second pixel electrode over the EL layer,
   wherein the thin film transistor comprises:
   a gate electrode on an insulating surface;
   a second insulating film over the gate electrode;
   a semiconductor film over the second insulating film;
   an impurity semiconductor film over the semiconductor film; and
   a conductive film over the impurity semiconductor film,
   wherein a cavity is formed adjacent to the gate electrode and between the second insulating film and the insulating surface, and the semiconductor film has a first recessed portion which overlaps with the cavity.

10. The EL display device according to claim 9, wherein the semiconductor film has a second recessed portion which is a channel region.

* * * * *